(12) United States Patent
Lee

(10) Patent No.: US 11,362,159 B2
(45) Date of Patent: Jun. 14, 2022

(54) DISPLAY DEVICE HAVING A BENDING REGION

(71) Applicant: Samsung Display Co., Ltd., Yongin-si (KR)

(72) Inventor: Hyeon Bum Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 14 days.

(21) Appl. No.: 16/714,771

(22) Filed: Dec. 15, 2019

(65) Prior Publication Data

US 2020/0321406 A1    Oct. 8, 2020

(30) Foreign Application Priority Data

Apr. 2, 2019 (KR) .................. 10-2019-0038663

(51) Int. Cl.
*H01L 27/32*      (2006.01)
*H01L 51/00*      (2006.01)
*H01L 51/52*      (2006.01)
*G02F 1/133*      (2006.01)
(Continued)

(52) U.S. Cl.
CPC .......... *H01L 27/326* (2013.01); *H01L 27/322* (2013.01); *H01L 27/323* (2013.01); *H01L 51/5206* (2013.01); *H01L 51/5221* (2013.01); *H01L 51/5237* (2013.01); *G02F 1/133514* (2013.01); *G06F 2203/04111* (2013.01); *H01L 27/3211* (2013.01); *H01L 27/3216* (2013.01); *H01L 27/3218* (2013.01);
(Continued)

(58) Field of Classification Search
CPC ... H01L 27/326; H01L 27/322; H01L 27/323; H01L 51/5206; H01L 51/5221; H01L 51/0097; H01L 2251/5338; H01L 2251/301; H01L 27/3211; H01L 27/3216; H01L 27/3218; H01L 33/12; G02F 1/133514; G02F 2001/133519; G02F 1/136222
See application file for complete search history.

(56) References Cited

U.S. PATENT DOCUMENTS 9,013,463 B2    4/2015    Jeon
9,661,114 B2*   5/2017    Jeong .................. H01L 27/3276
9,791,949 B2*  10/2017    Myers .................. G06F 3/0488
(Continued)

FOREIGN PATENT DOCUMENTS

KR    10-1905793    10/2018

*Primary Examiner* — Ida M Soward
(74) *Attorney, Agent, or Firm* — H.C. Park & Associates, PLC

(57) ABSTRACT

A display device includes a display substrate including a flat main region including a plurality of pixels, a flat subsidiary region, and a bending region disposed between the flat main region and the flat subsidiary region; a first layer disposed on the display substrate, the first layer including a bending opening portion in the bending region exposing the bending region of the display substrate; a bending organic layer disposed on the bending region exposed by the bending opening portion of the first layer; a plurality of light-emitting elements disposed on the first layer in the pixels, respectively, wherein the plurality of light-emitting elements includes a plurality of color filters, respectively, and wherein the bending organic layer includes the same material as at least one of the color filters.

21 Claims, 12 Drawing Sheets

(51) Int. Cl.
  *H01L 33/12* (2010.01)
  *G02F 1/1335* (2006.01)
(52) U.S. Cl.
  CPC .......... *H01L 33/12* (2013.01); *H01L 51/0097* (2013.01); *H01L 2251/301* (2013.01); *H01L 2251/5338* (2013.01)

(56) References Cited

U.S. PATENT DOCUMENTS

| | | | | |
|---|---|---|---|---|
| 9,812,659 | B2* | 11/2017 | Kwon | H01L 27/323 |
| 10,446,769 | B2* | 10/2019 | Kim | H01L 27/3258 |
| 10,551,877 | B2* | 2/2020 | Park | H01L 51/0097 |
| 10,777,101 | B2* | 9/2020 | Park | H01L 51/5036 |
| 10,818,871 | B2* | 10/2020 | Kim | H01L 27/3276 |
| 2016/0293870 | A1* | 10/2016 | Nakagawa | H01L 51/5246 |
| 2016/0308151 | A1* | 10/2016 | Kim | H01L 51/0097 |
| 2017/0221978 | A1* | 8/2017 | Kajiyama | H01L 27/1248 |
| 2017/0250366 | A1* | 8/2017 | Andou | H01L 27/3276 |
| 2017/0271616 | A1* | 9/2017 | Choi | H01L 51/0097 |
| 2017/0277288 | A1* | 9/2017 | Choi | H01L 51/5253 |
| 2017/0294620 | A1* | 10/2017 | Park | H01L 51/5284 |
| 2018/0047802 | A1* | 2/2018 | Yoon | H01L 27/3276 |
| 2018/0090698 | A1* | 3/2018 | Jeong | H01L 51/0097 |
| 2018/0123060 | A1* | 5/2018 | Jang | H01L 51/0097 |
| 2018/0231216 | A1* | 8/2018 | Hirakata | F21V 15/012 |
| 2018/0259805 | A1* | 9/2018 | Takehara | H01L 27/1225 |
| 2018/0284525 | A1* | 10/2018 | Notoshi | G02F 1/133305 |
| 2018/0286938 | A1* | 10/2018 | Moon | H01L 27/1248 |
| 2018/0293936 | A1* | 10/2018 | Fujioka | H01L 51/5203 |
| 2018/0342707 | A1* | 11/2018 | Lee | H01L 27/3258 |
| 2018/0366586 | A1* | 12/2018 | Son | H01L 29/7869 |
| 2019/0012031 | A1* | 1/2019 | Kim | H01L 27/3276 |
| 2019/0164998 | A1* | 5/2019 | Cho | G09G 3/3266 |
| 2019/0165048 | A1* | 5/2019 | Kim | H01L 51/0097 |
| 2019/0179466 | A1* | 6/2019 | Kim | G06F 3/0443 |
| 2019/0288048 | A1* | 9/2019 | Kang | H01L 27/1218 |
| 2019/0341443 | A1* | 11/2019 | Son | H01L 51/56 |
| 2020/0089351 | A1* | 3/2020 | Jeong | G06F 3/0446 |
| 2020/0089368 | A1* | 3/2020 | Shim | H01L 51/56 |
| 2020/0303665 | A1* | 9/2020 | Saeki | H01L 51/0097 |
| 2020/0319488 | A1* | 10/2020 | Asozu | G02F 1/1339 |
| 2021/0041976 | A1* | 2/2021 | Gwon | H01L 27/3246 |

* cited by examiner

SL1_1: SCE, GCE, TCE3, TCE4
SL2_1: TCE2, SCE, GCE, TCE3, TCE4
SL3_1: TCE1, SCE, GCE, TCE3, TCE4

DISPLAY DEVICE HAVING A BENDING REGION

CROSS REFERENCE TO RELATED APPLICATION

This application claims priority from and the benefit of Korean Patent Application No. 10-2019-0038663, filed on Apr. 2, 2019, which is hereby incorporated by reference for all purposes as if fully set forth herein.

BACKGROUND

Field

Exemplary embodiments of the invention relate generally to a display device and, more specifically, to a display device including a touch member.

Discussion of the Background

Electronic devices that provide images to a user, such as a smartphone, a tablet PC, a digital camera, a laptop computer, a navigation device and a smart TV, include a display device for displaying images. Such a display device includes a display panel for generating and displaying an image and various input means.

Recently, a touch panel that recognizes a touch input has been widely employed for display devices of smartphones or tablet PCs. A touch panel determines whether a touch input is received, and, if any, finds the coordinates of the position of the touch input. The touch panel comprises a plurality of sensing electrodes. The touch sensitivity may vary depending on the capacitance around the sensing electrodes. For example, if there is a step in the display panel, the capacitance is affected thereby. As a result, there may be a variation in the touch sensitivity for different parts of the display panel.

The above information disclosed in this Background section is only for understanding of the background of the inventive concepts, and, therefore, it may contain information that does not constitute prior art.

SUMMARY

Devices constructed according to exemplary embodiments of the invention are capable of providing a display device that may be fabricated with reduced number of masks during the manufacturing process.

Additional features of the inventive concepts will be set forth in the description which follows, and in part will be apparent from the description, or may be learned by practice of the inventive concepts.

According to one or more exemplary embodiments of the invention, a display device includes a display substrate including a flat main region including a plurality of pixels, a flat subsidiary region, and a bending region disposed between the flat main region and the flat subsidiary region; a first layer disposed on the display substrate, the first layer including a bending opening portion in the bending region exposing the bending region of the display substrate; a bending organic layer disposed on the bending region exposed by the bending opening portion of the first layer; a plurality of light-emitting elements disposed on the first layer in the pixels, respectively, wherein the plurality of light-emitting elements includes a plurality of color filters, respectively, and wherein the bending organic layer includes the same material as at least one of the color filters.

The first layer may include: a buffer layer disposed on the display substrate; a first insulating layer disposed on the buffer layer; a first conductive layer disposed on the first insulating layer; and a second insulating layer disposed on the first conductive layer.

The plurality of color filters may include first color filters, second color filters, and third color filters disposed in the plurality of pixels, respectively, the first color filters, the second color filters, and the third color filters including different materials from each other.

The bending organic layer may include the same materials as at least two of the first color filters, the second color filters, and third color filters.

The display device may further include a second conductive layer disposed between the second insulating layer and the plurality of light-emitting elements; and an encapsulation layer disposed on the plurality of light-emitting elements, wherein each of the plurality of light-emitting elements may include: an anode electrode in contact with the second conductive layer; a cathode electrode disposed on the anode electrode; and an emissive layer disposed between the anode electrode and the cathode electrode.

The display device may further include: a first touch conductive layer disposed on the encapsulation layer; a first touch insulating layer disposed on the first touch conductive layer; a second touch conductive layer disposed on the first touch insulating layer; and a second touch insulating layer disposed on the second touch conductive layer, wherein the plurality of color filters may be disposed between the first touch insulating layer and the second touch conductive layer.

The first touch conductive layer may include a first touch bridge electrode, the second touch conductive layer may include a first touch driving electrode, a touch sensing electrode and a second touch bridge electrode electrically connecting between the first touch driving electrode and an adjacent first touch driving electrode, and the first touch sensing electrode may be electrically connected to an adjacent first touch sensing electrode by the first touch bridge electrode.

The first touch conductive layer may be disposed directly on the encapsulation layer.

The second conductive layer may include a source connection electrode, the second touch conductive layer may include a first touch connection electrode in contact with the source connection electrode through a first contact hole, the first conductive layer may include a gate connection electrode in contact with the second source connection electrode through a second contact hole, and the first contact hole may be located farther from the bending region than the second contact hole is in a plan view.

The second touch conductive layer further may include a second touch connection electrode in contact with the gate connection electrode through a third contact hole and disposed on the bending organic layer, and the second contact hole nay be located farther from the bending region than the third contact hole in the plan view.

The second touch connection electrode may overlap with the bending organic layer in a thickness direction.

The display device may further include a first bending organic layer covering the second touch connection electrode, and the second touch connection electrode may be disposed between the first bending organic layer and the bending organic layer.

The first bending organic layer may include a material that is same as that of at least one of the plurality of color filters and may be different from that of the bending organic layer.

The display device may further include a second bending organic layer disposed on the first bending organic layer, wherein the first bending organic layer may be disposed between the second bending organic layer and the second touch connection electrode, and wherein the second bending organic layer may include a material that is same as that of at least one of the plurality of color filters and is different from that of each of the bending organic layer and the first bending organic layer.

The first touch conductive layer may be disposed on the display substrate, the bending organic layer may be disposed between the second touch connection electrode and the third touch connection electrode, the bending organic layer may include a fourth contact hole, and wherein the second touch connection electrode may be electrically connected to the first touch conductive layer through the fourth contact hole.

The bending region may be bent away from a display surface, and the flat subsidiary region may overlap with the flat main region in a thickness direction.

The display device may further include a driving chip and a driving board disposed on the flat subsidiary region, the driving chip may be located closer to the bending region than the driving board in a plan view.

According to one or more exemplary embodiments of the invention, a display device includes a display substrate including a flat main region including a plurality of pixels, a flat subsidiary region, and a bending region disposed between the flat main region and the flat subsidiary region; a bending organic layer disposed on the bending region of the display substrate; a buffer layer first on the display substrate; a first insulating layer disposed on the buffer layer; a first conductive layer disposed on the first insulating layer; a second insulating layer disposed on the first conductive layer; a plurality of light-emitting elements disposed on the second insulating layer in the pixels, respectively; and a plurality of color filters disposed above the light-emitting elements, respectively, the plurality of color filters including first color filters, second color filters, and third color filters disposed in the pixels, respectively, the first color filters, the second color filters, and the third color filters including different materials from each other, wherein the buffer layer, the first insulating layer and the second insulating layer include a bending open portion that overlaps with the bending region of the display substrate, the bending open portion exposes the bending region of the display substrate, wherein the bending organic layer is disposed on the bending open portion exposed by the bending open portion, and wherein the bending organic layer includes a same material as that of at least one of the first color filters, the second color filters, and the third color filters.

The display device may further include a second conductive layer disposed between the second insulating layer and the light-emitting elements, an encapsulation layer disposed on the light-emitting elements, and a touch member disposed directly on the encapsulation layer, the touch member further may include a first touch conductive layer disposed directly on the encapsulation layer, a first touch insulating layer disposed on the first touch conductive layer, a second touch conductive layer disposed on the first touch insulating layer, and a second touch insulating layer disposed on the second touch conductive layer, and the first color filter may be disposed between the first touch insulating layer and the second touch conductive layer.

The second conductive layer may include a source connection electrode, the second touch conductive layer may include a first touch connection electrode in contact with the source connection electrode through a first contact hole, the first conductive layer may include a gate connection electrode in contact with the second source connection electrode through a second contact hole, the first contact hole may be located farther from the bending region than the second contact hole in a plan view, and the second touch connection electrode may overlap with the bending organic layer in a thickness direction.

The second conductive layer further includes a second touch connection electrode in contact with the gate connection electrode through a third contact hole and disposed on the bending organic layer, and wherein the second contact hole is located farther from the bending region than the third contact hole in the plan view.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
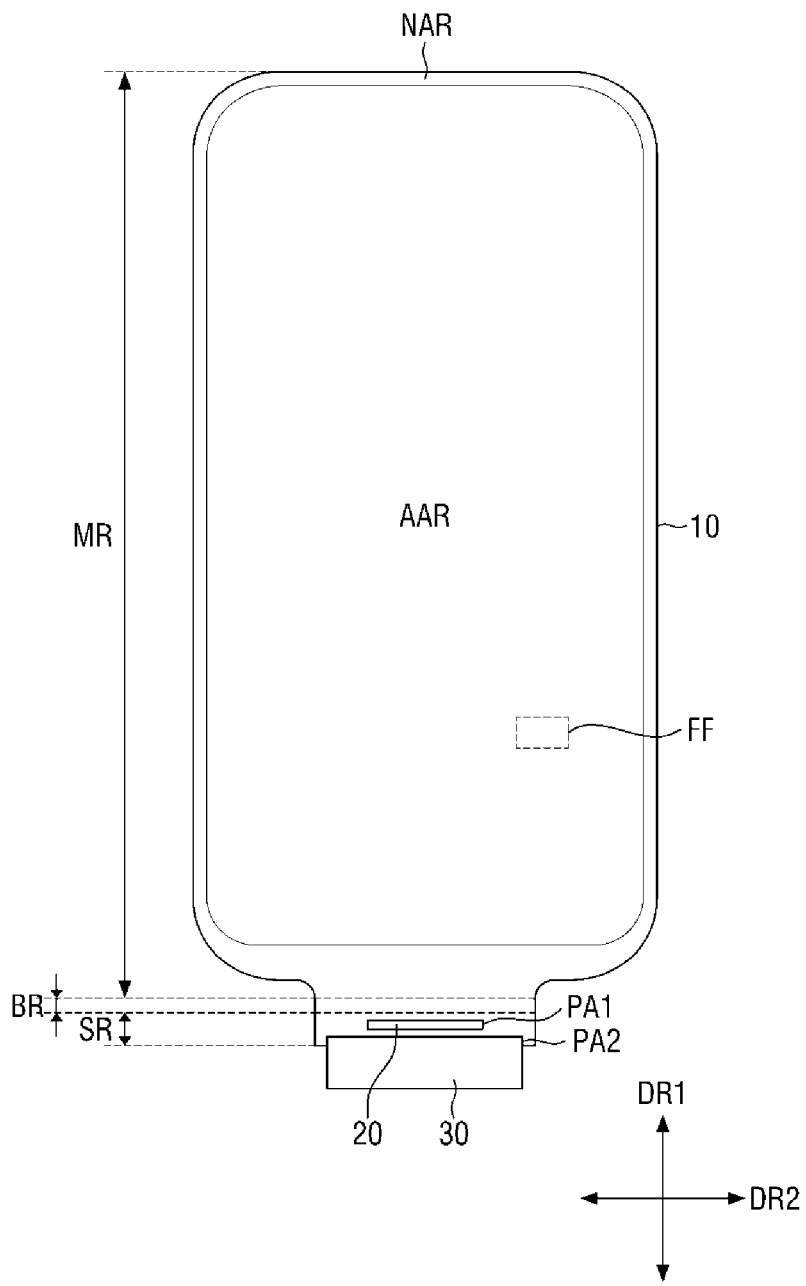
FIG. 1 is a plan view of a display device according to an exemplary embodiment of the present disclosure.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis and the DR2-axis are not limited to axes of a rectangular coordinate system, such as the x, y, and z-axes, and may be interpreted in a broader sense. For example, the DR1-axis and the DR2-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the present disclosure will be described in detail with reference to the accompanying drawings.

Figure 2:
FIG. 2 is a cross-sectional view of a part of a display device according to an exemplary embodiment of the present disclosure.

FIG. 1 is a plan view of a display device according to an exemplary embodiment of the present disclosure. FIG. 2 is a cross-sectional view of a part of a display device according to an exemplary embodiment of the present disclosure.

In some exemplary embodiments, the first direction DR1 may intersect the second direction DR2. In the plan view of FIG. 1, the first direction DR1 is defined as the vertical direction and the second direction DR2 is defined as the horizontal direction for convenience of illustration. In the following description, the upper arrow in the first direction DR1 indicates the upper side, the lower arrow in the first direction DR1 indicates the lower side, the right arrow in the second direction DR2 indicates the right side, and the left arrow in the second direction DR2 indicates the left side when viewed from the top. It should be understood that the directions referred with respect to the exemplary embodiments are relative directions, and the exemplary embodiments are not limited to the directions mentioned.

Referring to FIGS. 1 and 2, a display device 1 may refer to any electronic device providing a display screen. The display device 1 may include portable electronic devices for providing a display screen, such as a mobile phone, a smartphone, a tablet personal computer (PC), an electronic watch, a smart watch, a watch phone, a mobile communications terminal, an electronic notebook, an electronic book, a portable multimedia player (PMP), a navigation device, a game console and a digital camera, as well as a television set, a laptop computer, a monitor, an electronic billboard, the Internet of Things devices, etc.

The display device 1 includes an active area AAR and a non-active area NAR. In the display device 1, a display area may be defined as an area where images are displayed while a non-display area may be defined as an area where no image is displayed. In addition, a touch area may be defined as an area where a touch input is sensed. Then, the display area and the touch area may be included in the active area AAR. The display area and the touch area may overlap with each other. That is to say, in the active area As a result, images may be displayed and a touch input may be sensed. The shape of the active area AAR may be a rectangle or a rectangle with rounded corners. In the example shown, the shape of the active area AAR is a rectangle that has rounded corners and has its sides in the first direction DR1 longer than its sides in the second direction DR2. It is, however, to be understood that the present disclosure is not limited thereto. The active area AAR may have various shapes such as a rectangular shape with its sides in the second direction DR2 longer than its sides in the first direction DR1, a square shape, other polygonal shapes, a circular shape, and an elliptical shape.

The non-active area NAR is disposed around the active area AAR. The non-active area NAR may be a bezel area. The non-active area NAR may surround all sides (four sides in the drawings) of the active area AAR. It is, however, to be understood that the present disclosure is not limited thereto. For example, the non-active area NAR may not be disposed near the upper side of the active region AAR or near the left or right side thereof.

In the non-active area NAR, signal lines for applying signals to the active area AAR (display area or touch area) or driving circuits may be disposed. The non-active area NAR may include no display area. Further, the non-active area NAR may include no touch area. In another exemplary embodiment, the non-active area NAR may include a part of the touch area, and a sensor member such as a pressure sensor may be disposed in that part. In some exemplary embodiments, the active area AAR may be completely identical to the display area where images are displayed, while the non-active area NAR may be completely identical to the non-display area where no image is displayed.

The display device 1 includes a display panel 10 for providing a display screen. Examples of the display panel 10 may include an organic light-emitting display panel, a micro LED display panel, a nano LED display panel, a quantum-dot display panel, a liquid-crystal display panel, a plasma display panel, a field emission display panel, an electrophoretic display panel, an electrowetting display panel, etc. In the following description, an organic light-emitting display panel is employed as an example of the display panel 10, but the present disclosure is not limited thereto. Any other display panel may be employed as long as the technical idea of the present disclosure can be equally applied.

The display panel 10 may include a plurality of pixels. The plurality of pixels may be arranged in a matrix. The shape of each pixel may be, but is not limited to, a rectangle or a square when viewed from the top. Each pixel may have a diamond shape having sides inclined with respect to the first direction DR1. Each pixel may include an emission zone. Each emission region may have the same shape as or a different shape from the shape of the pixels. For example, when the pixels have a rectangular shape, the shape of the emission region of each of the pixels may have various shapes such as a rectangle, a diamond, a hexagon, an octagon, and a circle. A detailed description of the pixels and the emission regions will be given later.

The display device 1 may further include a touch member for sensing a touch input. The touch member may be provided as a separate panel or film from the display panel 10 to be attached on the display panel 10 or may be provided in the form of a touch layer inside the display panel 10. Although the touch member is provided inside the display panel to be included in the display panel 10 in the following description, it is to be understood that the present disclosure is not limited thereto.

The display panel 10 may include a flexible substrate including a flexible polymer material such as polyimide. Accordingly, the display panel 10 may be curved, bent, folded, or rolled.

The display panel 10 may include a bending region BR. The display panel 10 may be divided into a main region MR located on one side of the bending region BR and a subsidiary region SR located on the other side of the bending region BR.

The display area of the display panel 10 is located in the main region MR. In an exemplary embodiment, the edge portion of the display area in the main region MR, the entire bending region BR and the entire subsidiary region SR may be the non-display area. It is, however, to be understood that the present disclosure is not limited thereto. The bending region BR and/or the subsidiary region SR may also include the display area.

The main region MR may have a shape generally similar to that of the display device 1 when viewed from the top. The main region MR may be a flat area located in one plane. It is, however, to be understood that the present disclosure is not limited thereto. At least one of the edges of the main region MR except for the edge (side) connected to the bending region BR may be bent to form a curved surface or may be bent at a right angle.

When at least one of the edges of the main region MR except for the edge (side) connected to the bending region BR is curved or bent, the display area may also be disposed at the edge. It is, however, to be understood that the present disclosure is not limited thereto. The curved or bent edge may be the non-display area that does not display image, or the display area and the non-display area may be disposed together.

The bending region BR is connected to one side of the main region MR in the first direction DR1. For example, the bending region BR may be connected to the lower shorter side of the main region MR. The width of the bending region BR may be less than the width (width of the shorter side) of the main region MR. The portions where the main region MR meets the bending region BR may be cut in an L-shape.

In the bending region BR, the display panel 10 may be bent downward in the thickness direction, i.e., in the direction away from the display surface with a curvature. Although the bending region BR may have a constant radius of curvature, the present disclosure is not limited thereto. It may have different radii of curvature for difference sections. As the display panel 10 is bent at the bending region BR, the surface of the display panel 10 may be reversed. Specifically, the surface of the display panel 10 facing upward may be bent such that it faces outward at the bending region BR and then faces downward.

The subsidiary region SR is extended from the bending region BR. The sub-region SR may be extended in a direction parallel to the main region MR after the display device has been bent. The subsidiary region SR may overlap with the main region MR in the thickness direction of the display panel 10. The width of the subsidiary region SR (the width in the second direction DR2) may be, but is not limited to being, equal to the width of the bending region BR.

The subsidiary region SR may include a first pad area PA1 and a second pad area PA2 located farther from the bending region BR than the first pad area PA1 as shown in the plan view of FIG. 1. A driving chip 20 may be disposed in the first pad area PA1 of the subsidiary region SR. The driving chip 20 may include an integrated circuit for driving the display panel 10. The integrated circuit may include an integrated circuit for display and/or an integrated circuit for a touch unit. The integrated circuit for a display and the integrated circuit for a touch unit may be provided as separate chips or may be integrated into a single chip.

A plurality of display signal line pads and a plurality of touch signal line pads may be disposed in the second pad area PA2 of the subsidiary region SR of the display panel 10. A driving board 30 may be connected to the second pad area PA2 of the subsidiary region SR of the display panel 10. The driving board 30 may be a flexible printed circuit board or a film.

Figure 3:
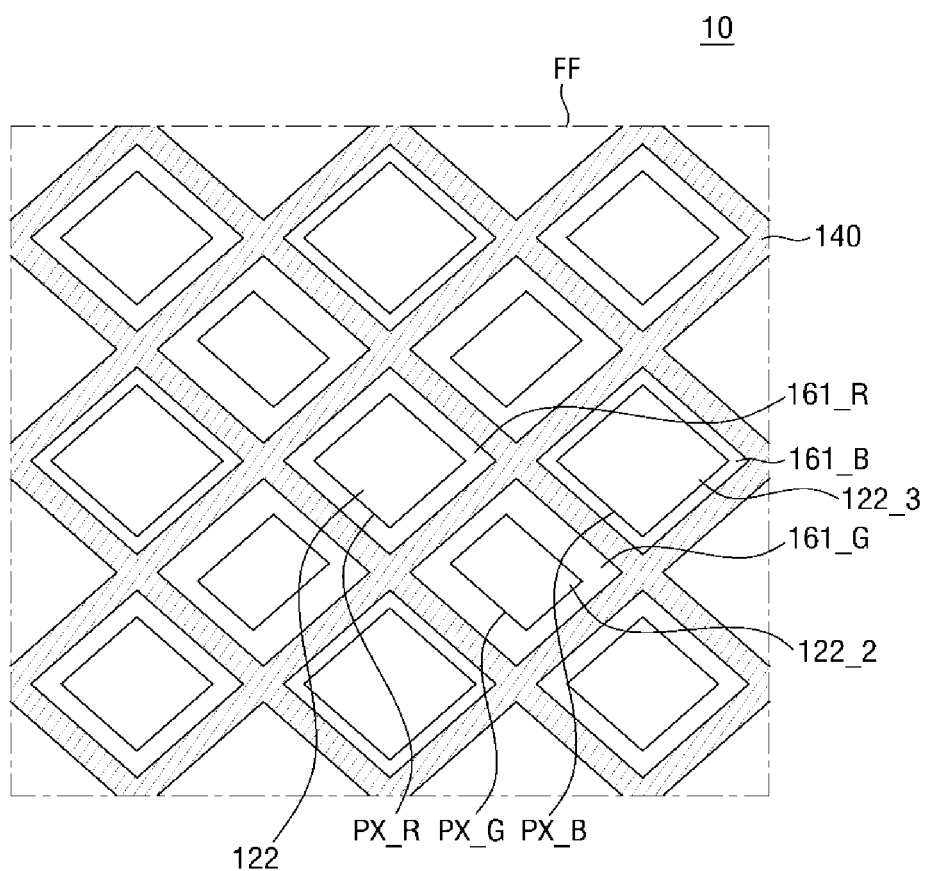
FIG. 3 is an enlarged view showing the layout of portion FF of FIG. 1.

FIG. 3 is an enlarged view showing the layout of portion FF of FIG. 1.

Referring to FIG. 3, the display device 1 includes a plurality of pixels PX_R, PX_G and PX_B arranged in a matrix. The plurality of pixels PX_R, PX_G and PX_B may be a plurality of color pixels. For example, the plurality of pixels may include a red pixel PX_R, a green pixel PX_G, and a blue pixel PX_B. In addition, the plurality of pixels may further include a white pixel. In other exemplary embodiments, cyan, magenta and yellow pixels may be disposed, instead of the red, green and blue pixels. In the following description, an example in which the display device 1 includes red, green and blue pixels PX_R, PX_G and PX_B will be described.

The red, green and blue pixels PX_R, PX_G and PX_B may be arranged in a repeated sequence. Each of the pixels PX_R, PX_G and PX_B may have a rectangular shape. The sizes of the pixels PX_R, PX_G and PX_B may be different from each other. For example, the blue pixel PX_B may be larger than the red pixel PX_R, and the red pixel PX_R may be larger than the green pixel PX_G. It is to be noted that the relative sizes of the pixels PX_R, PX_G and PX_B are not limited thereto.

Each of the pixels PX_R, PX_G and PX_B includes an organic emissive layer 122 and one of color filters 161_R, 161_G and 161_B. In an exemplary embodiment, the first color filter 161_R may be a red color filter, the second color filter 161_G may be a green color filter, and the third color filter 161_B may be a blue color filter. The red pixel PX_R may include a red organic emissive layer 122_1 and a red color filter 161_R. The green pixel PX_G may include a green organic emissive layer 122_2 and a green color filter 161_G. The blue pixel PX_B may include a blue organic emissive layer 122_3 and a blue color filter 161_B. In another exemplary embodiment, each of the red, green and blue pixels PX_R, PX_G and PX_B may include a white organic emissive layer and the respective color filter. The white organic emissive layer may be formed by stacking two or more organic emissive layers.

The red color filter 161_R selectively transmits red light. The wavelength of the red light may range from approximately 620 nm to 750 nm. The green color filter selectively transmits green light. The wavelength of the green light may range from approximately 495 nm to 570 nm. The blue color filter selectively transmits blue light. The wavelength of the blue light may range from approximately 450 nm to 495 nm.

The first color filter 161_R may be disposed in the red pixel PX_R, the second color filter 161_G may be disposed in the green pixel PX_G, and the third color filter 161_B may be disposed in the blue pixel PX_B. The color filters 161_R, 161_G, and 161_B of the same color are disposed on the respective organic emissive layers 122, thereby preventing or suppressing color mixture in the pixels and increasing color gamut. Also, since the color filters 161_R, 161_G, and 161_B substantially absorb external light, the reflection of external light can be reduced even without further disposing a polarizing plate or the like.

The shapes of the first color filter 161_R, the second color filter 161_G and the third color filter 161_B may be substantially identical to as those of the pixels described above. That is to say, when the pixels have a diamond shape, each of the color filters may also have a diamond shape.

A black matrix 140 is disposed at the boundary between the pixels. The black matrix 140 may have a lattice shape to define each of the pixels PX_R, PX_G, and PX_B.

Figure 4:
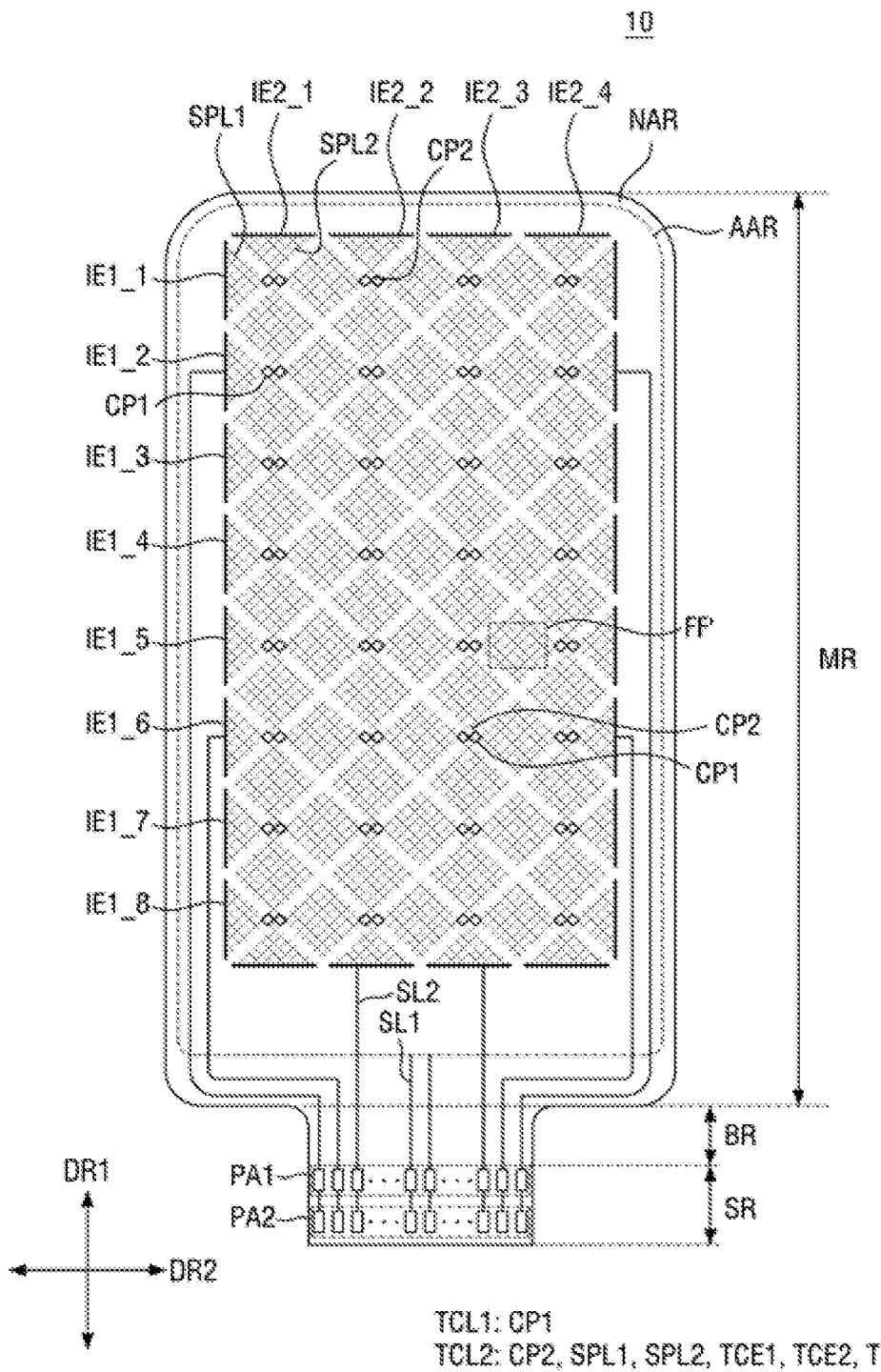
FIG. 4 is a plan view showing the layout of the display panel including a touch sensing member according to an exemplary embodiment of the present disclosure.
Figure 5:
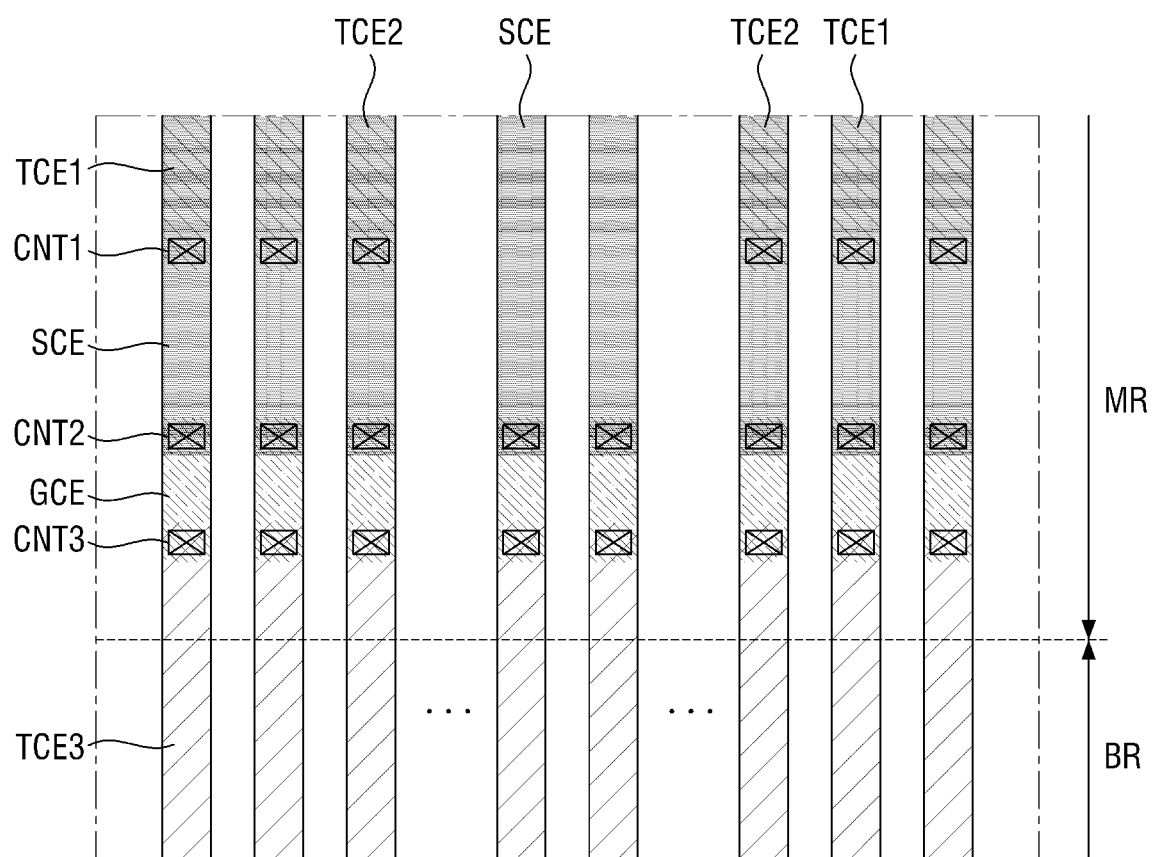
FIG. 5 is a plan view showing the layout of the conductive layers arranged in the main region and the bending region.
Figure 6:
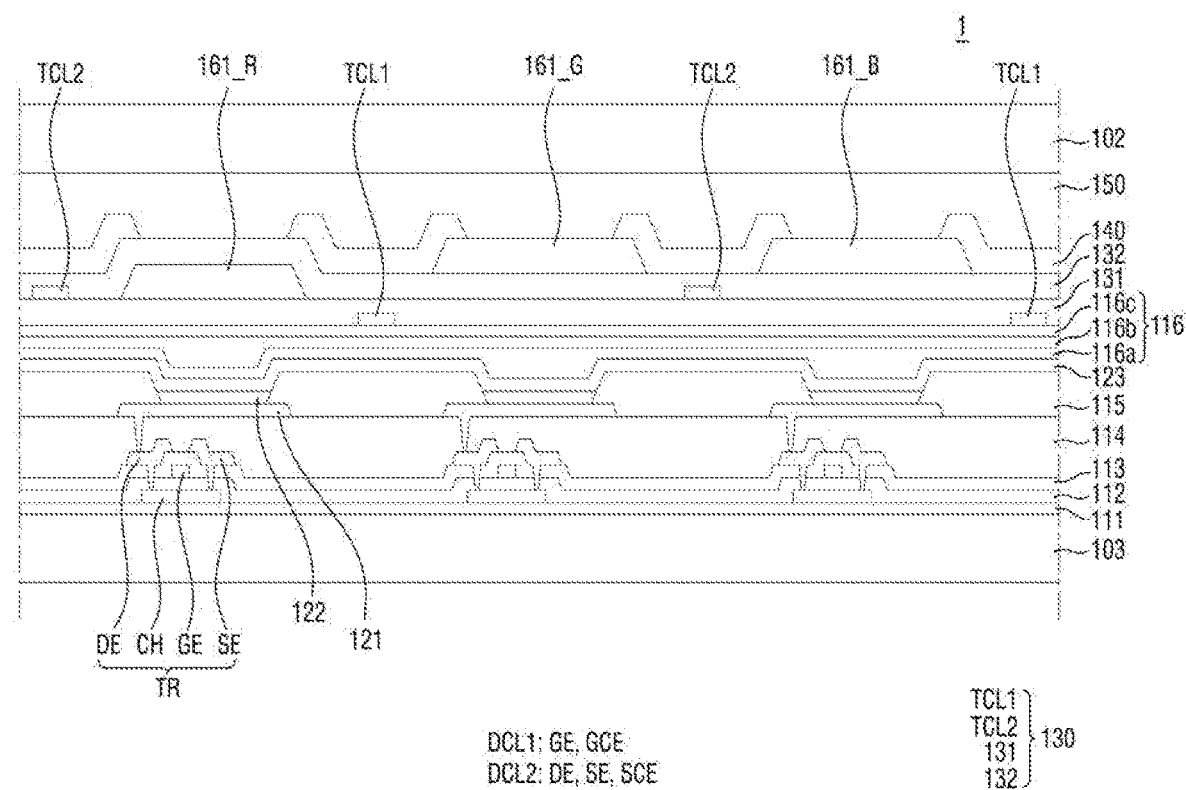
FIG. 6 is a cross-sectional view of the main region of the display panel according to the exemplary embodiment of the present disclosure.
Figure 7:
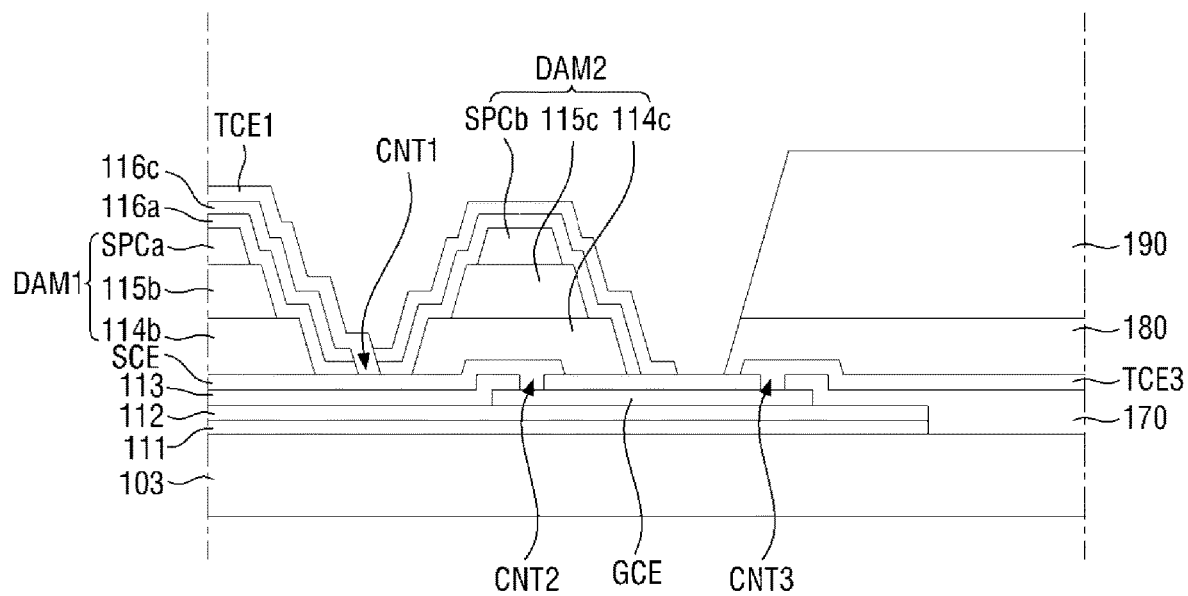
FIG. 7 is a cross-sectional view of the main region and the bending region of the display panel according to an exemplary embodiment of the present disclosure.
Figure 8:
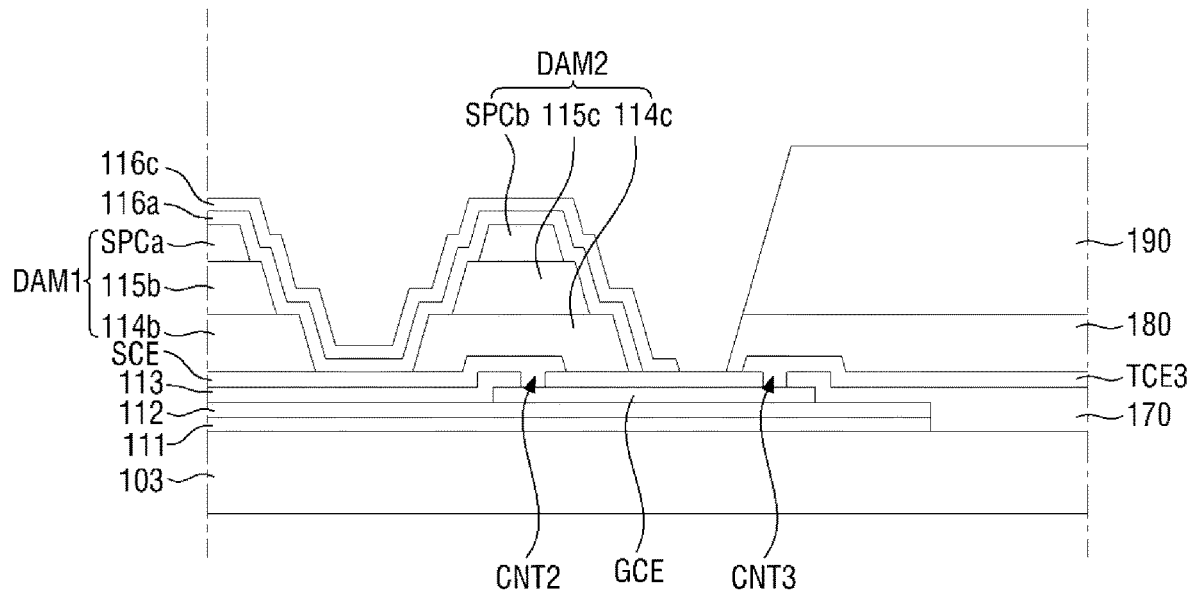
FIG. 8 is a cross-sectional view of the main region and the bending region of the display panel according to an exemplary embodiment of the present disclosure.

FIG. 4 is a plan view showing the layout of the display panel including a touch sensing member according to an exemplary embodiment of the present disclosure. FIG. 5 is a plan view showing the layout of the conductive layers arranged in the main region and the bending region. FIG. 6 is a cross-sectional view of the main region of the display panel according to the exemplary embodiment of the present disclosure. FIG. 7 is a cross-sectional view of the main region and the bending region of the display panel according to an exemplary embodiment of the present disclosure. FIG. 8 is a cross-sectional view of the main region and the bending region of the display panel according to an exemplary embodiment of the present disclosure.

Referring to FIGS. 3, 4, 5, 6, 7, and 8, the display device 1 may include a first substrate 103, a plurality of conductive layers, insulating layers, light-emitting elements, an encapsulation layer, a touch sensing member, a plurality of color filters and a black matrix disposed on the first substrate 103.

The first substrate 103 may be a flexible substrate as described above. For example, the first substrate 103 may be a film substrate including a polymer organic substance or a plastic substrate. For example, the first substrate 103 may be formed of a material selected from the group consisting of: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. In addition, the first substrate 103 may include fiberglass reinforced plastic (FRP).

A buffer layer 111 is disposed on the first substrate 103. The buffer layer 111 provides a flat surface over the first substrate 103 and prevents or suppresses the permeation of moisture or external air. The buffer layer 111 may be an inorganic layer. The buffer layer 111 may be made up of a single layer or multiple layers.

On the buffer layer 111, a plurality of thin-film transistors TR is disposed. The plurality of thin-film transistors TR may be driving thin-film transistors. At least one thin-film transistor TR may be disposed in each of the pixels. Each of the thin-film transistors TR may include a semiconductor layer CH, a gate electrode GE, a source electrode SE, and a drain electrode DE.

More specifically, the semiconductor layer CH is disposed on the buffer layer 111. The semiconductor layer CH may include amorphous silicon, poly silicon, and an organic semiconductor. In another exemplary embodiment, the semiconductor layer CH may be an oxide semiconductor. Although not shown in the drawing, the semiconductor layer CH may include a channel region, and a source region and a drain region which are disposed on the sides of the channel region, respectively, and are doped with impurities.

A gate insulating layer 112 is disposed on the semiconductor layer CH. The gate insulating layer 112 may be an inorganic layer. The gate insulating layer 112 may be made up of a single layer or multiple layers.

A first conductive layer DCL1 may be disposed on the gate insulating layer 112. The first conductive layer DCL1 may include the gate electrode GE and a gate connection electrode GCE. The gate connection electrode GCE may be in contact with a source connection electrode SCE electrically connected to the thin-film transistor of each pixel through a second contact hole CNT2 and may be in contact with a third touch connection electrode TCE3 of the second touch conductive layers TCL2 of the touch sensing member through a third contact hole CNT3.

The first conductive layer DCL1 may be made of a conductive metal material. For example, the first conductive layer DCL1 may include molybdenum (Mo), aluminum (Al), copper (Cu), and titanium (Ti). The first conductive layer DCL1 may be made up of a single layer or multiple layers.

An interlayer dielectric layer 113 is disposed on the first conductive layer DCL1. The interlayer dielectric layer 113 may be an inorganic layer. The interlayer dielectric layer 113 may be made up of a single layer or multiple layers.

A second conductive layer DCL2 may be disposed on the interlayer dielectric layer 113. The second conductive layer DCL2 may include the source electrode SE, the drain electrode DE, and the source connection electrode SCE. Besides, the second conductive layer DCL2 may include, but is not limited to, a high-level voltage line, a low-level voltage line, and a plurality of data lines.

The source electrode SE and the drain electrode DE may be electrically connected to the source region and the drain region of the semiconductor layer CH, respectively, through a contact hole formed through the interlayer dielectric layer 113 and the gate insulating layer 112.

The source connection electrode SCE may be electrically connected to the thin-film transistor of each pixel. The source connection electrode SCE may be in contact with the first touch connection electrode TCE1 of the first touch conductive layers TCL1 of the touch sensing member through the first contact hole CNT1.

The second conductive layer DCL2 is made of a conductive metal material. For example, the second conductive layer DCL2 may include aluminum (Al), copper (Cu), titanium (Ti), and molybdenum (Mo).

Although not shown in the drawings, the display device 1 may further include a storage capacitor and a switching thin-film transistor on the first substrate 103.

A protective layer 114 is disposed over the second conductive layer DCL2 and the interlayer dielectric layer 113. The protective layer 114 is disposed to cover a pixel circuitry including the thin-film transistor TR. The protective layer 114 may be a passivation layer or a planarization layer. The passivation layer may include SiO2, SiNx, etc., and the planarization layer may include materials such as acrylic and polyimide. The protective layer 114 may include both the passivation layer and the planarization layer. Then, the passivation layer may be disposed over the source electrode SE, the drain electrode DE and the interlayer dielectric layer 113, and the planarization layer may be disposed on the passivation layer.

A plurality of first electrodes 121 may be disposed on the protective layer 114. The first electrodes 121 may be pixel electrodes each disposed in the respective pixels. In addition, each of the first electrodes 121 may be an anode electrode of an organic light-emitting diode.

The first electrode 121 may be electrically connected to the drain electrode DE or the source electrode SE disposed on the first substrate 103 through a via hole passing through the protective layer 114.

The first electrode 121 may include a material having a high work function. The first electrode 121 may include indium-tin-oxide (ITO), indium-zinc-oxide (IZO), zinc oxide (ZnO), indium oxide (In$_2$O$_3$), etc. The above-listed conductive materials have a relatively high work function and are transparent. When the organic light-emitting display device is a top-emission organic light-emitting display device, the first electrode 121 may further include a reflective material such as silver (Ag), magnesium (Mg), aluminum (Al), platinum (Pt), lead (Pb), gold (Au), nickel (Ni), neodymium (Nd), iridium (Ir), chrome (Cr), lithium (Li), calcium (Ca) or a combination thereof, in addition to the above-listed conductive materials. Accordingly, the first electrodes 121 may have a single-layer structure including the above-listed conductive material and the reflective material, or may have a multi-layer structure in which the single layers are stacked on one another.

An bank 115 is disposed over the first electrode 121. The bank 115 includes openings each exposing at least a part of the respective first electrodes 121. The bank 115 may include an organic material or an inorganic material. In an exemplary embodiment, the bank 115 may include a material such as a photoresist, a polyimide resin, an acrylic resin, a silicon compound and a polyacrylic resin.

The organic emissive layer 122 is disposed on the first electrode 121 exposed by the bank 115.

A second electrode 123 is disposed on the organic emissive layer 122. The second electrode 123 may be a common electrode extended across all the pixels. In addition, the second electrode 123 may be a cathode electrode of an organic light-emitting diode.

The second electrode 123 may be made of a material having a low work function. The second electrode 123 may include Li, Ca, LiF/Ca, LiF/Al, Al, Mg, Ag, Pt, Pd, Ni, Au, Nd, Ir, Cr, BaF, Ba, or a compound or mixture thereof, e.g., a mixture of Ag and Mg. The second electrode 123 may further include an auxiliary electrode. The auxiliary electrode may include a layer formed by depositing the material, and a transparent metal oxide on the layer such as indium-tin-oxide (ITO), indium-zinc-oxide (IZO), zinc oxide (ZnO) and indium-tin-zinc-oxide (ITZO).

When the display device 1 is a top-emission organic light-emitting diode display device, a thin conductive layer having a small work function may be formed as the second electrode 123, and a transparent conductive layer such as indium-tin-oxide (ITO) layer, an indium-zinc-oxide (IZO) layer, a zinc oxide (ZnO) layer and an indium oxide (In$_2$O$_3$) layer may be formed thereon.

The above-described first electrode 121, the organic emissive layer 122 and the second electrode 123 may form an organic light-emitting diode.

Although not shown in the drawings, a hole injection layer and/or a hole transport layer may be disposed between the first electrode 121 and the organic emissive layer 122, and an electron transport layer and/or an electron injection layer may be disposed between the organic emissive layer 122 and the second electrode 123.

An encapsulation layer 116 is disposed on the second electrode 123. The encapsulation layer 116 includes at least one inorganic layer, and at least one organic layer. The at least one inorganic layer and the at least one organic layer may be stacked on one another. For example, the encapsulation layer 116 may be made up of multiple layers including a first inorganic encapsulation layer 116a, an organic encapsulation layer 116b and a second inorganic encapsulation layer 116c which are stacked on one another one another in this order, as shown in FIG. 6. The first inorganic encapsulation layer 116a and the second inorganic encapsulation layer 116c may include one or more selected from the group consisting of: silicon oxide (SiOx), silicon nitride (SiNx) and silicon oxynitride (SiONx). The organic encapsulation layer 116b may include one selected from the group consisting of epoxy, acrylate and urethane acrylate.

The touch sensing member is disposed on the encapsulation layer 116. The encapsulation layer 116 and the touch sensing member may be in contact with each other directly. That is to say, the touch sensing member may be disposed directly on the encapsulation layer 116. As shown in FIG. 6, the first touch conductive layers TCL1 of the touch sensing member may be disposed directly on the encapsulation layer 116.

Referring to FIG. 4, the touch sensing member may include a first touch conductive layers TCL1, a first touch insulating layer 131 disposed on the first touch conductive layers TCL1, a second touch conductive layers TCL2 disposed on the first touch insulating layer 131, and a second touch insulating layer 132 disposed on the second touch conductive layers TCL2.

The first touch conductive layers TCL1 may include a first touch bridge electrode CP1 for electrically connecting between adjacent ones of first sensing electrodes IE1_1 to IE1_8. The second touch conductive layers TCL2 may include the plurality of first sensing electrodes IE1_1 to IE1_8 and a plurality of second sensing electrodes IE2_1 to IE2_4 and may further include a second touch bridge electrode CP2 for electrically connecting between adjacent ones of the second sensing electrodes IE2_1 to IE2_4.

The plurality of first sensing electrodes IE1_1 to IE1_8 may be extended in the second direction DR2 and may be arranged in the first direction DR1. The plurality of second sensing electrodes IE2_1 to IE2_4 may be extended in the first direction DR1 and may be arranged in the second direction DR2.

Each of the plurality of first sensing electrodes IE1-1 to IE1-8 may include a plurality of first sensing lines SPL1 having a mesh shape. The areas defined by the plurality of first sensing lines SPL1 may overlap with the organic emissive layers 122_1, 122_2, and 122_3 (see FIG. 2).

Each of the plurality of second sensing electrodes IE2-1 to IE2-4 may include a plurality of second sensing lines SPL2 having a mesh shape. The areas defined by the plurality of second sensing lines SPL2 may also overlap with the organic emissive layers. The areas defined by the plurality of first sensing lines SPL1 and the areas defined by the plurality of second sensing lines SPL2 may have a diamond shape, for example. As used herein, the term a diamond shape encompasses not only a diamond shape but also a simple geometric shape approximating a diamond shape under different processing conditions.

The first sensing lines SPL1 are electrically insulated from the second sensing lines SPL2. In an exemplary embodiment, the plurality of first sensing lines SPL1 may be disposed on the same layer as the plurality of second sensing lines SPL2. In such case, the plurality of first touch bridge electrodes CP1 and the plurality of second touch bridge electrodes CP2 are disposed in different layers, thereby being electrically insulated from each other.

In some exemplary embodiments, the electrodes of the first touch conductive layers TCL1 may be disposed in the second touch conductive layers TCL2, and vice versa.

In some exemplary embodiments, the first touch conductive layers TCL1 may include first sensing electrodes IE1_1 to IE1_8 and a first touch bridge electrode CP1, and the second touch conductive layers TCL2 may include second sensing electrode IE2_1 to IE2_4 and a second touch bridge electrode CP2.

In some exemplary embodiments, the first touch conductive layers TCL1 may include second sensing electrodes IE2_1 to IE2_4 and a second touch bridge electrode CP2, and the second touch conductive layers TCL2 may include first sensing electrode IE1_1 to IE1_8 and a first touch bridge electrode CP1.

In the following description, the first touch conductive layers TCL1 may include the first touch bridge electrode CP1 for electrically connecting adjacent first sensing electrodes IE1_1 to IE1_8. An example will be described where the second touch conductive layers TCL2 includes the plurality of first sensing electrodes IE1_1 to IE1_8 and the plurality of second sensing electrodes IE2_1 to IE2_4 and further includes the second touch bridge electrode CP2 for electrically connecting the adjacent second sensing electrodes IE2_1 to IE2_4.

The first touch conductive layers TCL1 may further include the first touch connection electrode TCE1 to the third touch connection electrode TCE3. The first and second touch connection electrodes TCE1 and TCE2 may be electrically connected to the source connection electrode SCE through the first contact hole CNT1. The third touch connection electrode TCE3 may be electrically connected to the gate connection electrode GCE through the third contact hole CNT3.

The plurality of first sensing lines SPL1 and the plurality of second sensing lines SPL2 may include a conductive material. In an exemplary embodiment, the conductive material may include a low-resistance metal such as silver (Ag), aluminum (Al), chromium (Cr) and nickel (Ni), or a conductive nano material such as a silver nanowire and a carbon nanotube.

Referring to FIG. 4, the touch sensing member may be connected to the first sensing electrodes IE1_1 to IE1_8 and the second sensing electrodes IE2_1 to IE2_4 and may further include a second signal line SL2 and a third signal line SL3 passing through the first pad area PA1 and the second pad area PA2. The second signal line SL2 may be electrically connected to the second sensing electrodes IE2_1 to IE2_4 of the touch sensing member. The first signal line SL1 may be electrically connected to the first sensing electrodes IE1_1 to IE1_8 of the touch sensing member.

The second signal line SL2 may include the second touch connection electrode TCE2 electrically connected to the second sensing electrodes IE2_1 to IE2_4 of the touch sensing member, the source connection electrode SCE electrically connected to the second touch connection electrode TCE2 through the first contact hole CNT1, the gate connection electrode GCE electrically connected to the source connection electrode SCE through the second contact hole CNT2, and the third touch connection electrode TCE3 connected to the gate connection electrode GCE through the third contact hole CNT3.

The third signal line SL3 may include the first touch connection electrode TCE1 electrically connected to the first sensing electrodes IE1_1 to IE1_8 of the touch sensing member, the source connection electrode SCE electrically connected to the first touch connection electrode TCE1 through the first contact hole CNT1, the gate connection electrode GCE electrically connected to the source connection electrode SCE through the second contact hole CNT2, and the third touch connection electrode TCE3 connected to the gate connection electrode GCE through the third contact hole CNT3.

In addition, as shown in FIG. 4, the display panel 10 may further include the first signal line SL1 that is electrically connected to the thin-film transistor of each pixel and passes through the first and second pad areas PA1 and PA2. The first signal line SL1 may include the source connection electrode SCE electrically connected to the thin-film transistor of each pixel, the gate connection electrode GCE electrically connected to the source connection electrode SCE through the second contact hole CNT2, and the third touch connection electrode TCE3 electrically connected to the gate connection electrode GCE through the third contact hole CNT3.

The first contact hole CNT1 may be located farther from the bending region BR than the second contact hole CNT2 and the third contact hole CNT3 are, and the second contact hole CNT2 may be located farther from the bending region BR3 than the third contact hole CNT3 is.

The first touch conductive layers TCL1 may be disposed directly on the encapsulation layer 116. It is, however, to be understood that the present disclosure is not limited thereto. In another exemplary embodiment, a single insulating layer or multiple insulating layers may be disposed between the encapsulation layer 116 and the first touch conductive layers TCL1.

The first touch insulating layer 131 may be disposed on the first touch conductive layers TCL1.

In an exemplary embodiment, the first touch insulating layer 131 may include an inorganic material. The inorganic material may include at least one selected from the group consisting of silicon oxide (SiOx), silicon nitride (SiNx), and silicon oxynitride (SiONx). In another exemplary embodiment, the first touch insulating layer 131 may include an organic material. The organic material may include at least one selected from the group consisting of: an acrylic resin, a methacrylic resin, a polyisoprene, a vinyl resin, an epoxy resin, a urethane resin, a cellulose resin, a siloxane resin, a polyimide resin, a polyamide resin, and a perylene resin.

The plurality of second touch conductive layers TCL2 may be disposed on the first touch insulating layer 131. The touch electrode and the touch bridge electrode of the second touch conductive layers TCL2 may overlap with the black matrix 140 and the bank 115. Accordingly, it is possible to hide them from viewers.

The second touch insulating layer 132 may be disposed on the first touch insulating layer 131 and the second touch conductive layers TCL2. In an exemplary embodiment, the second touch insulating layer 132 may include an inorganic material or an organic material. The types of the inorganic material and the organic material are the same as those of the first touch insulating layer 131; and, therefore, the redundant description will be omitted. Although the first touch insulating layer 131 and the second touch insulating layer 132 are depicted as single layers in FIG. 3, this is merely illustrative. They may have a multilayer structure. The second touch insulating layer 132 may be a passivation layer or a planarization layer.

As shown in FIG. 6, the red color filter 161_R may be disposed between the first touch insulating layer 131 and the second touch conductive layers TCL2 of the touch sensing member. As will be described in more detail, this is because the first touch conductive layers TCL1 and the first touch insulating layer 131 are formed and then the red color filter 161_R is formed.

The second touch conductive layers TCL2 and the second touch insulating layer 132 may be disposed on the red color filter 161_R. Since the touch electrodes and the touch bridge electrodes of the second touch conductive layers TCL2 overlap with the black matrix 140 and the bank 115, the red color filter 161_R is disposed between the second touch insulating layer 132 and the first touch insulating layer 131, and the touch electrodes and the touch bridge electrode of the second touch conductive layers TCL2 are disposed directly on the first touch insulating layer 131, as shown in the drawings.

On the other hand, the green color filter 161_G and the blue color filter 161_B may be disposed on the second touch conductive layers TCL2 and the second touch insulating layer 132. This is because the green color filter 161_G and the blue color filter 161_B are formed after the second touch conductive layers TCL2 and the second touch insulating layer 132 of the touch sensing member are deposited.

That is to say, the red color filter 161_R may not be formed on the same layer as the green color filter 161_G and the blue color filter 161_B but formed on the layer lower than the green color filter 161_G and the blue color filter 161_G.

It is, however, to be understood that the present disclosure is not limited thereto. When the green color filter 161_G or the blue color filter 161_B is formed before the second touch conductive layers TCL2 is formed, the green color filter 161_G or the blue color filter 161_B may be disposed between the first touch insulating layer 131 and the second touch conductive layers TCL2 of the touch sensing member, unlike the above-described example.

In some exemplary embodiments, two or more color filters may be disposed between the first touch insulating layer 131 and the second touch conductive layers TCL2 of the touch sensing member.

Referring to FIGS. 7 and 8, the protective layer 114 and the bank 115 may form dams DAM1 and DAM2 together with a spacer SPC. Specifically, the protective layer 114 may include a first sub-protective layer 114a forming a first dam DAM1 and a second sub-protective layer 114b forming the second dam DAM2. The bank 115 may include a first sub-bank 115a forming the first dam DAM1 and a second sub-bank 115b forming the second dam DAM2. The spacer SPC may include a first sub-spacer SPCa forming the first dam DAM1 and a second sub-spacer SPCb forming the second dam DAM2. The first dam DAM1 has a structure in which the first sub-protective layer 114a, the first sub-bank 115a, and the first sub-spacer SPCa are sequentially stacked. The second dam DAM2 may have a structure in which the second sub-protective layer 114b, the second sub-bank 115b, and the second sub-spacer SPCb are sequentially stacked. The first dam DAM1 and the second dam DAM2 can prevent or suppress the organic encapsulation layer 116b of the encapsulation layer 116 from overflowing to the bending region BR.

The first sub-protective layer 114a may be in contact with the source connection electrode SCE directly, and the second sub-protective layer 114b may be in contact with the source connection electrode SCE and the gate connection electrode GCE directly.

As shown in FIGS. 7 and 8, the first dam DAM1 and the second dam DAM2 may have a structure in which the first inorganic encapsulation layer 116a and the second inorganic encapsulation layer 116c are sequentially stacked on one another. They may be in contact with each other directly. The first inorganic encapsulation layer 116a may be in contact with the first dam DAM1 and the second dam DAM2 directly.

The first inorganic encapsulation layer 116a and the second inorganic encapsulation layer 116c may include the first contact hole CNT1 described above. The first inorganic encapsulation layer 116a may be in contact with the source connecting electrode SCE and the gate connecting electrode GCE directly, and the second inorganic encapsulation layer 116c may be in contact with the gate connection electrode GCE directly.

As shown in FIG. 7, the second touch connection electrode TCE2 of the second signal line SL2 and the third touch connection electrode TCE3 of the third signal line SL3 may be disposed on the second inorganic encapsulation layer 116c and may be in contact with the upper surface of the second inorganic encapsulation layer 116c directly. The second touch connection electrode TCE2 and the third touch connection electrode TCE3 may be electrically connected to the source connection electrode SCE through the first contact hole CNT1.

The first contact hole CNT1 may be, but is not limited to being, disposed between the first dam DAM1 and the second dam DA2 when viewed from the top.

The second contact hole CNT2 may be formed so that it overlaps with the second dam DAM2 in the thickness direction.

The buffer layer 111, the gate insulating layer 112 and the interlayer dielectric layer 113 may include a bending open portion in the bending region BR. The bending open portion may expose the upper surface of the first substrate 103.

A bending organic layer 170 may be disposed in the bending open portion. The bending organic layer 170 may include the same material as the constituent material of the red color filter 161_R. That is to say, the bending organic layer 170 may be formed via the same process as the red color filter 161_R.

The bending organic layer 170 may be disposed in the bending open portion to provide a flat surface over the step difference by the bending open portion so that the third touch connection electrode TCE3 can be disposed on the flat surface. In addition, the bending organic layer 170 includes an organic material to thereby suppress the bending stress from occurring when the display device 1 is bent, providing the display device 1 with that bending flexibility.

The bending organic layer 170 may be in contact with the side surfaces of the buffer layer 111, the gate insulating layer 112 and the interlayer dielectric layer 113. The bending organic layer 170 may be in contact with the first substrate 103 directly. The third touch connection electrode TCE3 may be electrically connected to the gate connection electrode GCE through the third contact hole CNT3. The third touch connection electrode TCE3 may be disposed on the bending organic layer 170.

A first bending organic layer 180 and a second bending organic layer 190 may be disposed on the third touch connection electrode TCE3. The first and second bending organic layers 180 and 190 may cover the third touch connection electrode TCE3. The first and second bending organic layers 180 and 190 may expose the third touch pad electrode TCE3 in the first pad area PA1 and the second pad area PA2. The first and second bending organic layers 180 and 190 can prevent or suppress electrical short-circuit between the first to third signal lines SL1 to SL3.

The first bending organic layer 180 may be disposed on the same layer as the green color filter 161_G and may be formed via the same process. The second bending organic layer 190 may be disposed on the same layer as the blue color filter 161_B and may be formed via the same process.

In some exemplary embodiments, only the first bending organic layer 180 may be disposed between the first substrate 103 and the third touch connection electrode TCE3 to provide a flat surface, only the second bending organic layer 190 may be disposed between the first substrate 103 and the third touch connection electrode TCE3 to provide a flat surface, or at least two of the bending organic layer 170, the first bending organic layer 180 and the second bending organic layer 190 may be disposed between the first substrate 103 and the third touch connection electrode TCE3 to provide a flat surface. The number of the organic layers may be determined depending on the processing order of the color filters 161_R, 161_G and 161_B.

As described above, since the bending organic layer 170 is formed via the same process with at least one of the color filters, e.g., the red color filter 161_R, it is possible to eliminate a mask otherwise required for forming additional organic layer in order to provide a flat surface for the third touch connection electrode TCE3. In this manner, it is possible to drastically reduce the cost and time required for the process of fabricating the display device 1.

The black matrix 140 is disposed on the color filters. The black matrix 140 is disposed along the boundaries between the pixels and includes openings exposing the pixels. The black matrix 140 may have a grid shape connected to each other along the boundaries of the pixels. The organic emissive layers 122 below the black matrix 140 may overlap with the openings of the black matrix 140, respectively.

The black matrix 140 may include a light-absorbing material or a light-reflecting material. For example, the black matrix 140 may include a resin colored with black or a reflective metal such as chromium (Cr), etc.

A window 102 may be disposed above the black matrix 140. The window 102 may include a flexible material and can cover the entire elements thereunder. The window 102 and the display panel 10 may be coupled to each other by using an inter-module adhesive layer 150 interposed therebetween.

Hereinafter, a method for fabricating the display device 1 will be described. In the following description, the same or similar elements will be denoted by the same or similar reference numerals, and redundant descriptions will be omitted or briefly described.

FIGS. 9, 10, 11, 12, 13, and 14 are cross-sectional views showing processing steps of fabricating a display panel according to an exemplary embodiment of the present disclosure.

Figure 9:
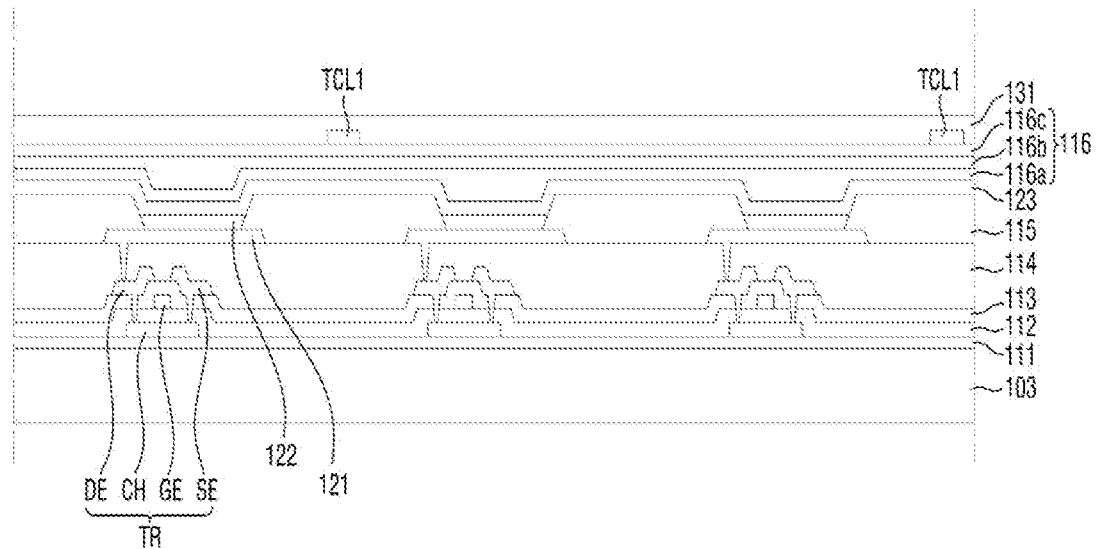
FIGS. 9, 10, 11, 12, 13, and 14 are cross-sectional views showing processing steps of fabricating a display panel according to an exemplary embodiment of the present disclosure.

Referring to FIG. 9, as described above with reference to FIG. 6, a first substrate 103, a plurality of conductive layers, a plurality of insulating layers, an organic emissive layer 122, and an encapsulation layer 116 of the display panel 10 are prepared. Subsequently, first touch conductive layers TCL1 are disposed on the encapsulation layer 116. The first touch conductive layers TCL1 may be disposed on the main region MR of the display device 1 but may not be disposed on the bending region BR and the subsidiary region SR.

The first touch conductive layers TCL1 may be deposited directly on the second inorganic encapsulation layer 116c of the encapsulation layer 116. As described above with reference to FIG. 6, the first touch conductive layers TCL1 may include a low-resistance metal such as silver (Ag), aluminum (Al), chromium (Cr) and nickel (Ni), or a conductive nano material such as a silver nanowire and a carbon nanotube.

Subsequently, the first touch insulating layer 131 is deposited on the first touch conductive layers TCL1. The first touch insulating layer 131 may include an inorganic material as described above. The inorganic material may include at least one selected from the group consisting of silicon oxide (SiOx), silicon nitride (SiNx), and silicon oxynitride (SiONx). In another exemplary embodiment, the first touch insulating layer 131 may include an organic material. The organic material may include at least one selected from the group consisting of: an acrylic resin, a methacrylic resin, a polyisoprene, a vinyl resin, an epoxy resin, a urethane resin, a cellulose resin, a siloxane resin, a polyimide resin, a polyamide resin, and a perylene resin.

Figure 10:
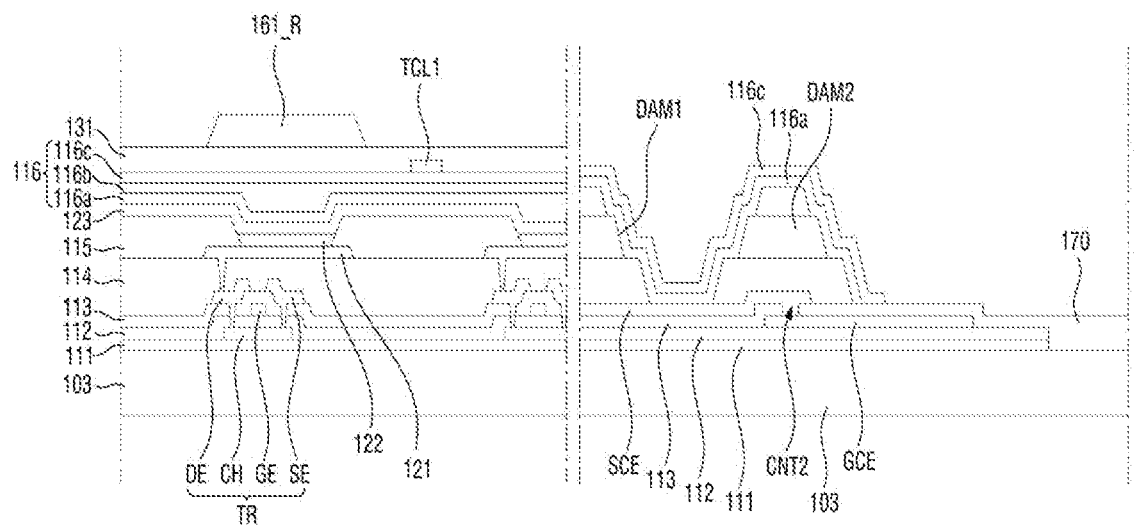

Subsequently, referring to FIG. 10, a first color filter 161_R is formed on the first touch insulating layer 131 in the main region MR of the display device 1, and a bending organic layer 170 is formed on the first substrate 103 in the bending open portion of the buffer layer 111, the gate insulating layer 112 and the interlayer dielectric layer 113 in the bending region BR.

The first color filter 161_R may be a red color filter. The first color filter 161_R and the bending organic layer 170 may be formed via the same process. Specifically, the first color filter 161_R and the bending organic layer 170 may be formed together by depositing the constituent material of the first color filter 161_R on the locations where the first color filter 161_R and the bending organic layer 170 are to be disposed by using a first mask including openings.

Figure 11:
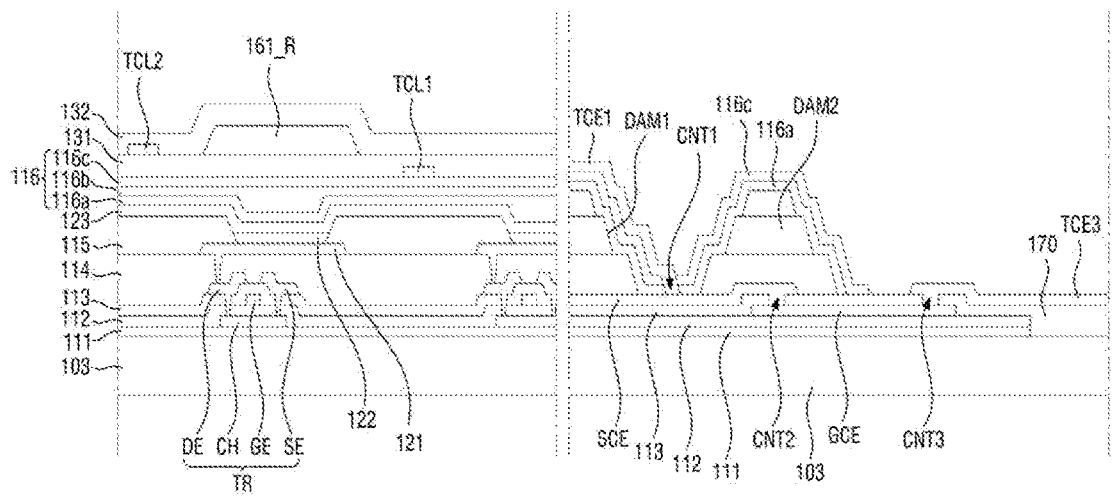

Subsequently, referring to FIG. 11, the second touch conductive layers TCL2 is formed on the first color filter 161_R in the main region MR, and the second touch conductive layers TCL2 is formed on the bending organic layer 170 in the bending region BR.

The red color filter 161_R may be disposed between the first touch insulating layer 131 and the second touch conductive layers TCL2 of the touch sensing member. As described above, this is because the first touch conductive layers TCL1 and the first touch insulating layer 131 are formed and then the red color filter 161_R is formed.

The first touch connection electrode TCE1 and the second touch connection electrode TCE2 may be disposed on the second inorganic encapsulation layer 116c and may be in contact with the upper surface of the second inorganic encapsulation layer 116c directly. The first touch connection electrode TCE1 and the second touch connection electrode TCE2 may be electrically connected to the source connection electrode SCE through the first contact hole CNT1.

The third touch connection electrode TCE3 may be deposited on the bending organic layer 170.

As described above with reference to FIG. 6, the second touch conductive layers TCL2 may include a low-resistance metal such as silver (Ag), aluminum (Al), chromium (Cr) and nickel (Ni), or a conductive nano material such as a silver nanowire and a carbon nanotube.

Subsequently, the second touch insulating layer 132 is formed on the second touch conductive layers TCL2 in the main region MR. The second touch insulating layer 132 may include an inorganic material as described above. The inorganic material may include at least one selected from the group consisting of silicon oxide (SiOx), silicon nitride (SiNx), and silicon oxynitride (SiONx). In another exemplary embodiment, the second touch insulating layer 132 may include an organic material. The organic material may include at least one selected from the group consisting of: an acrylic resin, a methacrylic resin, a polyisoprene, a vinyl resin, an epoxy resin, a urethane resin, a cellulose resin, a siloxane resin, a polyimide resin, a polyamide resin, and a perylene resin.

Figure 12:
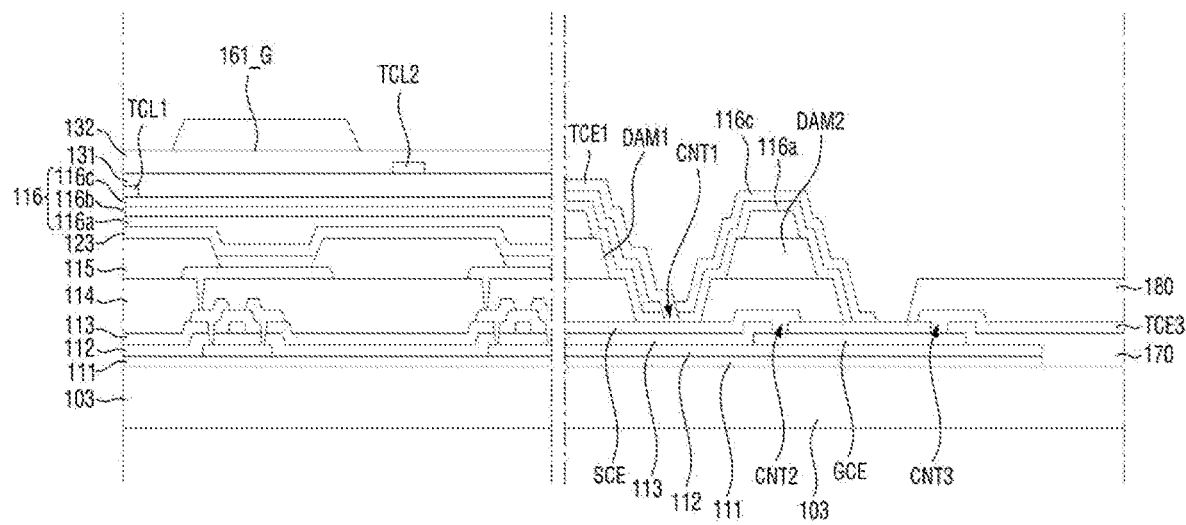

Subsequently, referring to FIG. 12, the second color filter 161_G is formed on the second touch insulating layer 132 in the main region MR of the display device 1, and a first bending organic layer 180 is formed on the third touch connection electrode TCE3 in the bending region BR.

The second color filter 161_G may be a green color filter. The second color filter 161_G and the first bending organic layer 180 may be formed via the same process. Specifically, the second color filter 161_G and the first bending organic layer 180 may be formed together by depositing the constituent material of the second color filter 161_G on the locations where the second color filter 161_G and the first bending organic layer 180 are to be disposed by using a second mask including openings.

Figure 13:
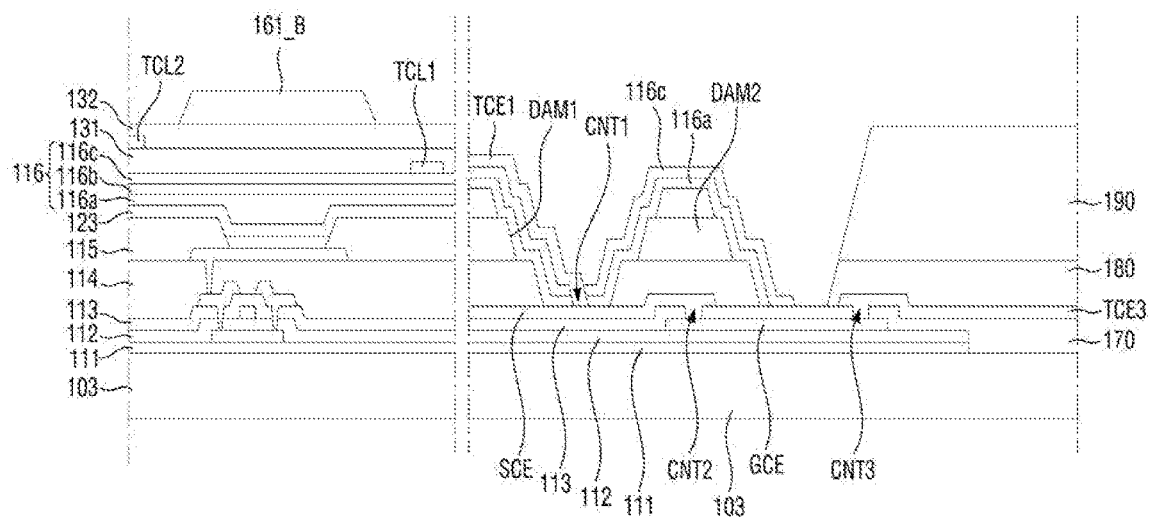

Subsequently, referring to FIG. 13, the third color filter 161_B is formed on the second touch insulating layer 132 in the main region MR of the display device 1, and the second bending organic layer 190 is formed on the first bending organic layer 180 in the bending region BR.

The third color filter 161_B may be a blue color filter. The third color filter 161_B and the second bending organic layer 190 may be formed via the same process. Specifically, the third color filter 161_B and the second bending organic layer 190 may be formed together by depositing the constituent material of the third color filter 161_B on the locations where the second color filter 161_B and the second bending organic layer 190 are to be disposed by using a third mask including openings.

Figure 14:
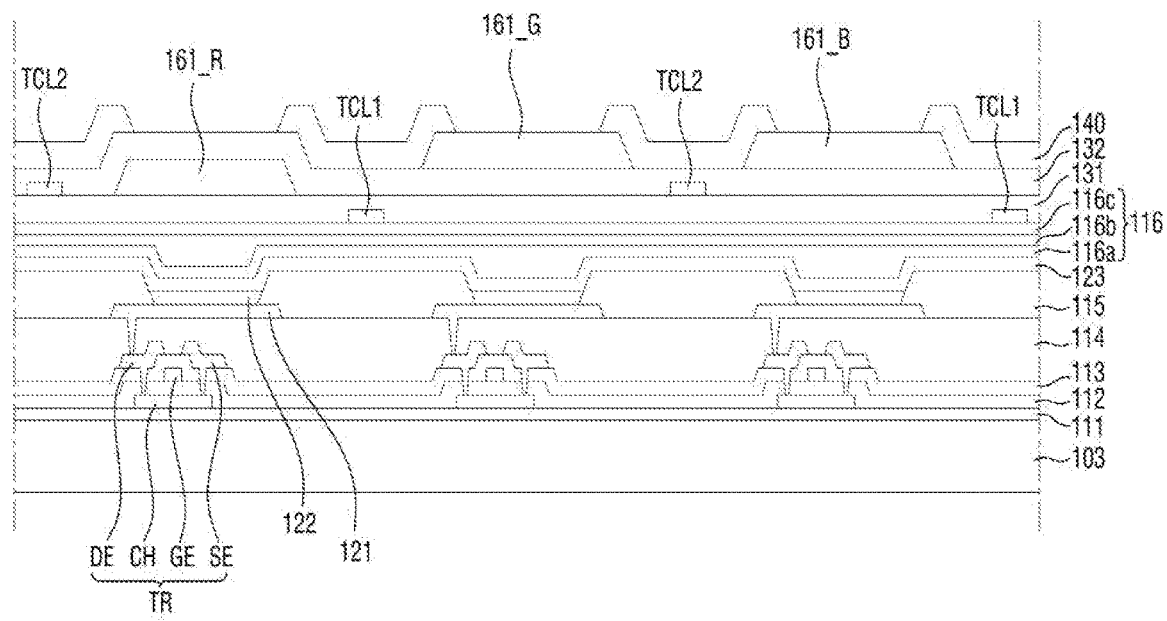

Subsequently, referring to FIG. 14, the black matrix 140 is disposed on the plurality of color filters 161_R, 161_G, and 161_B. The black matrix 140 is disposed along the boundaries between the pixels and includes openings exposing the pixels. The black matrix 140 may have a grid shape connected to each other along the boundaries of the pixels. The organic emissive layers 122 below the black matrix 140 may overlap with the openings of the black matrix 140, respectively.

The black matrix 140 may include a light-absorbing material or a light-reflecting material. For example, the black matrix 140 may include a resin colored with black or a reflective metal such as chromium (Cr), etc.

According to the method of fabricating the display device 1 according to the exemplary embodiment of the present disclosure, since the bending organic layer 170 is formed via the same process with at least one of the color filters, e.g., the red color filter 161_R, it is possible to eliminate a mask otherwise required for forming additional organic layer in order to provide a flat surface for the third touch connection electrode TCE3. In this manner, it is possible to drastically reduce the cost and time required for the process of fabricating the display device 1.

Hereinafter, display devices according to other exemplary embodiments of the present disclosure will be described. In the following description, the same or similar elements will be denoted by the same or similar reference numerals, and redundant descriptions will be omitted or briefly described.

Figure 15:
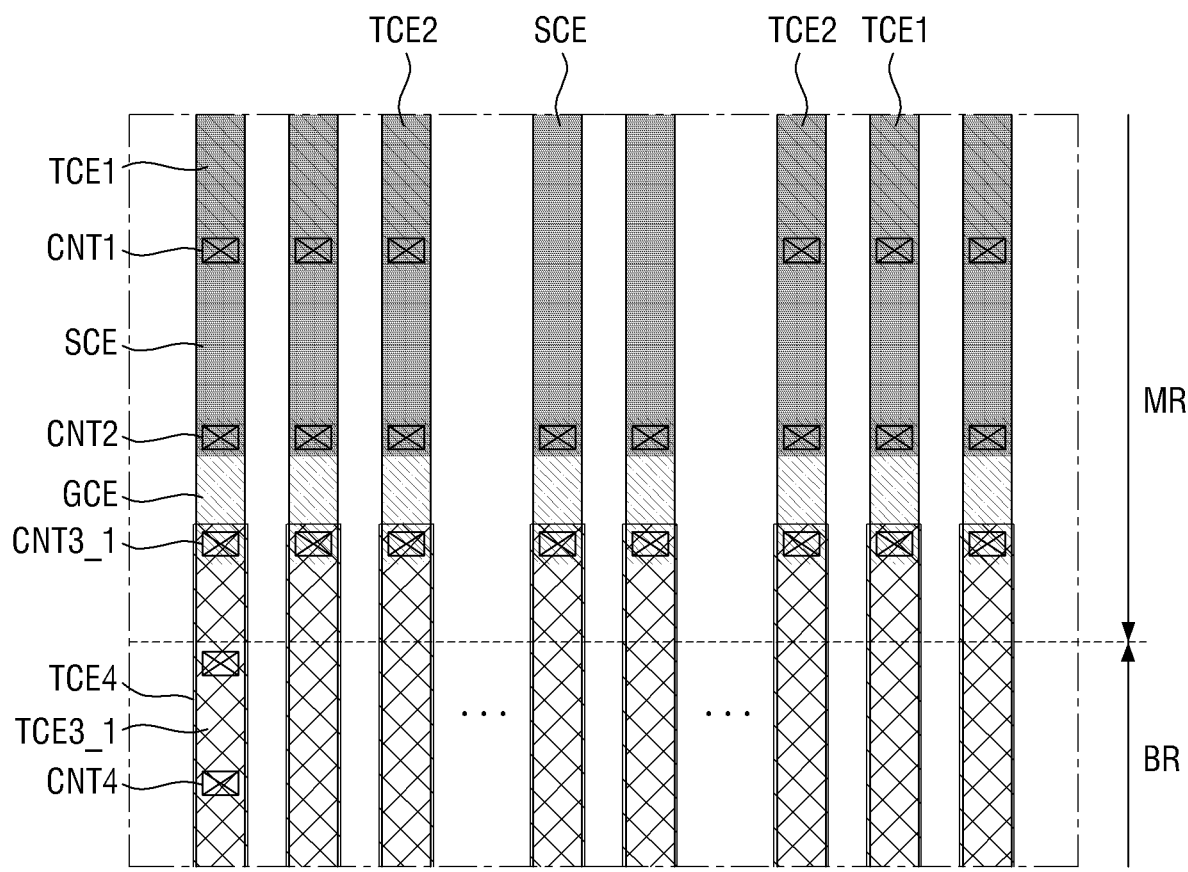
FIG. 15 is a plan view showing the layout of the conductive layers arranged in the main region and the bending region according to another exemplary embodiment.
Figure 16:
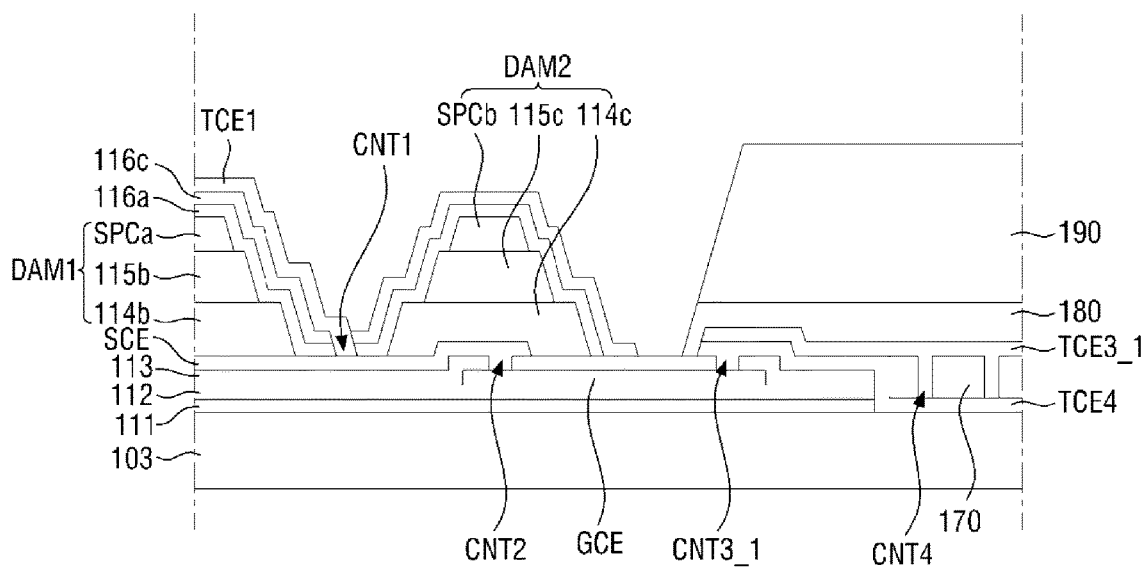
FIG. 16 is a cross-sectional view of the main region and the bending region of the display panel according to another exemplary embodiment of the present disclosure.
Figure 17:
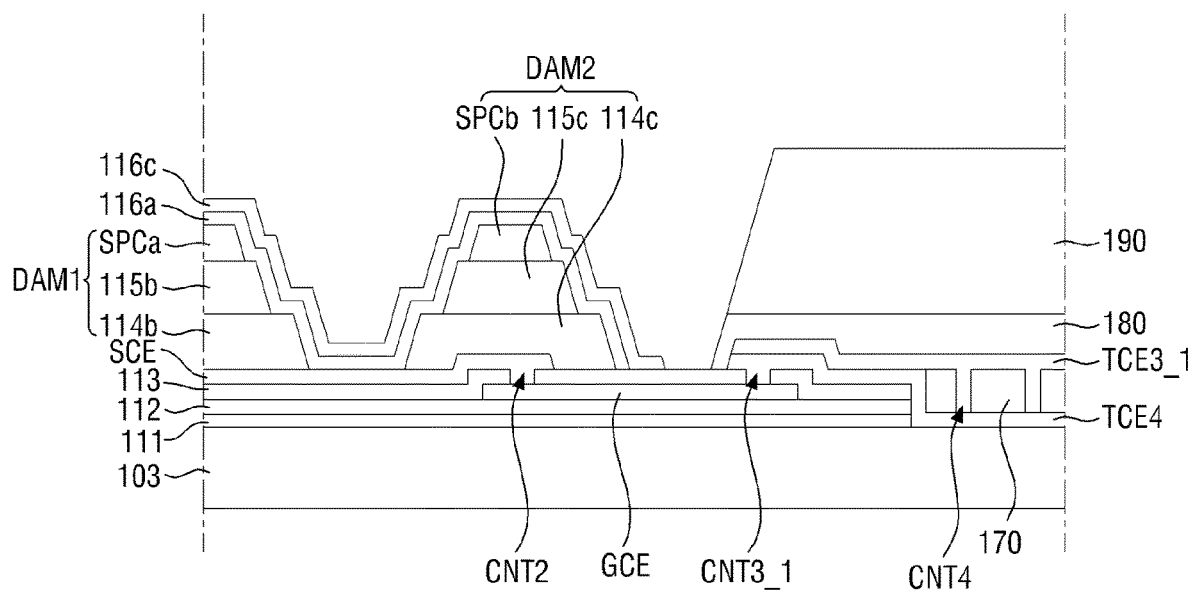
FIG. 17 is a cross-sectional view of the main region and the bending region of the display panel according to another exemplary embodiment of the present disclosure.

FIG. 15 is a plan view showing the layout of the conductive layers arranged in the main region and the bending region according to another exemplary embodiment. FIG. 16 is a cross-sectional view of the main region and the bending region of the display panel according to another exemplary embodiment of the present disclosure. FIG. 17 is a cross-sectional view of the main region and the bending region of the display panel according to another exemplary embodiment of the present disclosure.

A display device 1 according to the exemplary embodiment shown in FIGS. 15, 16, and 17 is substantially identical to the exemplary embodiment shown in FIGS. 5, 6, 7, and 8 except that first touch conductive layers TCL1 are further disposed in the bending region BR of the display panel 10_1.

More specifically, in the display panel 10_1 according to the present embodiment, a first touch conductive layers TCL1 may be further disposed in the bending region BR. Specifically, the first signal line SL1_1 may further include a fourth touch connection electrode TCE4 of the first touch conductive layers TCL1, the second signal line SL2_1 may further include the fourth touch connection electrode TCE4 of the first touch conductive layers TCL1, and the third signal line SL3_1 may further include the fourth touch connection electrode TCE4 of the first touch conductive layers TCL1.

The bending organic layer 170 may further include a fourth contact hole CNT4 in the bending region BR. The third touch connection electrode TCE3_1 may be electrically connected to the fourth touch connection electrode TCE4 through the fourth contact hole CNT4.

That is to say, the fourth touch connection electrode TCE4 may be disposed on the interlayer dielectric layer 113 and may be electrically connected to the gate connection electrode GCE through a third contact hole CNT3_1 of the interlayer dielectric layer 113. The fourth touch connection electrode TCE4 may be in contact with the exposed side surfaces of the interlayer dielectric layer 113, the gate insulating layer 112 and the buffer layer 111 in the bending region BR and may be disposed in the bending open portion. The fourth touch connection electrode TCE4 may be in contact with the upper surface of the first substrate 103 directly.

The bending organic layer 170 may be disposed on the fourth touch connection electrode TCE4 in the bending region BR, i.e., in the bending open portion. The bending organic layer 170 may include a fourth contact hole CNT4.

The third touch connection electrode TCE3_1 may be disposed on the fourth touch connection electrode TCE4. The third touch connection electrode TCE3_1 may overlap with the third contact hole CNT3_1 in the thickness direction. The third touch connection electrode TCE3_1 may be disposed on the bending organic layer 170. The third touch connection electrode TCE3_1 may be electrically connected to the fourth touch connection electrode TCE4 through the fourth contact hole CNT4.

In this manner, when the third touch connection electrode TCE3_1 is disconnected and accordingly an external signal cannot be transmitted to the thin-film transistor and/or the touch sensing member in each pixel through the signal line pad and/or touch signal line pad connected to the driving chip 20 or the driving board 30, the external signal can be transmitted to the thin-film transistor and/or the touch sensing member through the fourth touch connection electrode TCE4.

Some of the advantages that may be achieved by exemplary embodiments of the invention include the ability to fabricate a display device with a smaller number of masks.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display substrate comprising:
      a flat main region comprising a plurality of pixels;
      a flat subsidiary region; and
      a bending region disposed between the flat main region and the flat subsidiary region;
   a plurality of layers disposed on the display substrate, the plurality of layers not extending over the bending region of the display substrate to thereby expose the bending region;

a bending organic layer disposed on the exposed bending region;
a plurality of light-emitting elements disposed on the plurality of layers in the plurality of pixels, respectively; and
a plurality of color filters disposed on the plurality of light-emitting elements, respectively,
wherein the bending organic layer comprises the same material as at least one of the color filters.

2. The display device of claim 1, wherein the plurality of layers comprise:
a buffer layer disposed on the display substrate;
a first insulating layer disposed on the buffer layer; and
a second insulating layer disposed on the first insulating layer.

3. The display device of claim 1, wherein the plurality of color filters comprise first color filters, second color filters, and third color filters disposed in the plurality of pixels, respectively, the first color filters, the second color filters, and the third color filters comprising different materials from each other.

4. The display device of claim 3, wherein the bending organic layer comprises the same materials as at least two of the first color filters, the second color filters, and third color filters.

5. The display device of claim 2, further comprising:
a first conductive layer disposed between the first insulating layer and the second insulating layer;
a second conductive layer disposed between the second insulating layer and the plurality of light-emitting elements; and
an encapsulation layer disposed on the plurality of light-emitting elements,
wherein each of the plurality of light-emitting elements comprises:
an anode electrode in contact with the second conductive layer;
a cathode electrode disposed on the anode electrode; and
an emissive layer disposed between the anode electrode and the cathode electrode.

6. The display device of claim 5, further comprising:
a first touch conductive layer disposed on the encapsulation layer;
a first touch insulating layer disposed on the first touch conductive layer;
a second touch conductive layer disposed on the first touch insulating layer; and
a second touch insulating layer disposed on the second touch conductive layer,
wherein the plurality of color filters is disposed between the first touch insulating layer and the second touch conductive layer.

7. The display device of claim 6, wherein the first touch conductive layer comprises a first touch bridge electrode,
wherein the second touch conductive layer comprises a first touch driving electrode, a touch sensing electrode and a second touch bridge electrode electrically connecting between the first touch driving electrode and an adjacent first touch driving electrode, and
wherein the first touch sensing electrode is electrically connected to an adjacent first touch sensing electrode by the first touch bridge electrode.

8. The display device of claim 6, wherein the first touch conductive layer is disposed directly on the encapsulation layer.

9. The display device of claim 6, wherein the second conductive layer comprises a source connection electrode,
wherein the second touch conductive layer comprises a first touch connection electrode in contact with the source connection electrode through a first contact hole,
wherein the first conductive layer comprises a gate connection electrode in contact with the second source connection electrode through a second contact hole, and
wherein the first contact hole is located farther from the bending region than the second contact hole is in a plan view.

10. The display device of claim 9, wherein the second touch conductive layer further comprises a second touch connection electrode in contact with the gate connection electrode through a third contact hole and disposed on the bending organic layer, and
wherein the second contact hole is located farther from the bending region than the third contact hole in the plan view.

11. The display device of claim 10, wherein the second touch connection electrode overlaps with the bending organic layer in a thickness direction.

12. The display device of claim 11, further comprising: a first bending organic layer covering the second touch connection electrode,
wherein the second touch connection electrode is disposed between the first bending organic layer and the bending organic layer.

13. The display device of claim 12, wherein the first bending organic layer comprises a material that is same as that of at least one of the plurality of color filters and is different from that of the bending organic layer.

14. The display device of claim 13, further comprising: a second bending organic layer disposed on the first bending organic layer,
wherein the first bending organic layer is disposed between the second bending organic layer and the second touch connection electrode, and
wherein the second bending organic layer comprises a material that is same as that of at least one of the plurality of color filters and is different from that of each of the bending organic layer and the first bending organic layer.

15. The display device of claim 11, wherein the first touch conductive layer is disposed on the display substrate,
wherein the bending organic layer is disposed between the second touch connection electrode and a third touch connection electrode,
wherein the bending organic layer comprises a fourth contact hole, and
wherein the second touch connection electrode is electrically connected to the first touch conductive layer through the fourth contact hole.

16. The display device of claim 1, wherein the bending region is bent away from a display surface, and the flat subsidiary region overlaps with the flat main region in a thickness direction.

17. The display device of claim 16, further comprising: a driving chip and a driving board disposed on the flat subsidiary region,
wherein the driving chip is located closer to the bending region than the driving board in a plan view.

18. A display device comprising:
a display substrate comprising:
a flat main region comprising a plurality of pixels;

a flat subsidiary region; and
a bending region disposed between the flat main region and the flat subsidiary region;
a bending organic layer disposed on the bending region of the display substrate;
a buffer layer disposed on the display substrate;
a first insulating layer disposed on the buffer layer;
a first conductive layer disposed on the first insulating layer;
a second insulating layer disposed on the first conductive layer;
a plurality of light-emitting elements disposed on the second insulating layer in the plurality of pixels, respectively; and
a plurality of color filters disposed above the light-emitting elements, respectively, the plurality of color filters comprising first color filters, second color filters, and third color filters disposed in the pixels, respectively, the first color filters, the second color filters, and the third color filters comprising different materials from each other,
wherein the buffer layer, the first insulating layer, and the second insulating layer do not extend over the bending region of the display substrate to thereby expose the bending region of the display substrate,
wherein the bending organic layer is disposed on the exposed bending region, and
wherein the bending organic layer comprises a same material as that of at least one of the first color filters, the second color filters, and the third color filters.

19. The display device of claim 18, further comprising:
a second conductive layer disposed between the second insulating layer and the light-emitting elements;
an encapsulation layer disposed on the light-emitting elements; and
a touch member disposed directly on the encapsulation layer,
wherein the touch member further comprises:
a first touch conductive layer disposed directly on the encapsulation layer;
a first touch insulating layer disposed on the first touch conductive layer;
a second touch conductive layer disposed on the first touch insulating layer; and
a second touch insulating layer disposed on the second touch conductive layer, and
wherein the first color filter is disposed between the first touch insulating layer and the second touch conductive layer.

20. The display device of claim 19, wherein the second conductive layer comprises a source connection electrode,
wherein the second touch conductive layer comprises a first touch connection electrode in contact with the source connection electrode through a first contact hole,
wherein the first conductive layer comprises a gate connection electrode in contact with the second source connection electrode through a second contact hole,
wherein the first contact hole is located farther from the bending region than the second contact hole in a plan view, and
wherein the second touch connection electrode overlaps with the bending organic layer in a thickness direction.

21. The display device of claim 20, wherein the second conductive layer further comprises a second touch connection electrode in contact with the gate connection electrode through a third contact hole and disposed on the bending organic layer, and
wherein the second contact hole is located farther from the bending region than the third contact hole in the plan view.

\* \* \* \* \*